(12) United States Patent
Akimoto et al.

(10) Patent No.: US 12,557,591 B2
(45) Date of Patent: Feb. 17, 2026

(54) LINEARLY MOVING MECHANISM AND METHOD OF SUPPRESSING PARTICLE SCATTERING

(71) Applicant: Tokyo Electron Limited, Tokyo (JP)

(72) Inventors: Masami Akimoto, Koshi (JP); Naruaki Iida, Koshi (JP); Tsunenaga Nakashima, Koshi (JP); Keisuke Sasaki, Koshi (JP); Takahiro Yasutake, Koshi (JP); Kazuya Matsushita, Koshi (JP); Kousei Ide, Koshi (JP); Masato Ozeki, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 821 days.

(21) Appl. No.: 17/757,173

(22) PCT Filed: Dec. 7, 2020

(86) PCT No.: PCT/JP2020/045507
§ 371 (c)(1),
(2) Date: Jun. 10, 2022

(87) PCT Pub. No.: WO2021/117684
PCT Pub. Date: Jun. 17, 2021

(65) Prior Publication Data
US 2023/0021035 A1    Jan. 19, 2023

(30) Foreign Application Priority Data

Dec. 11, 2019 (JP) .................................. 2019-223916
Nov. 27, 2020 (JP) .................................. 2020-197365

(51) Int. Cl.
*H01L 21/67* (2006.01)
*H01L 21/673* (2006.01)
*H01L 21/677* (2006.01)

(52) U.S. Cl.
CPC .. *H01L 21/67715* (2013.01); *H01L 21/67178* (2013.01); *H01L 21/6719* (2013.01); *H01L 21/67389* (2013.01)

(58) Field of Classification Search
USPC ........................................................ 118/729
See application file for complete search history.

(56) References Cited

U.S. PATENT DOCUMENTS

2003/0121759 A1*  7/2003  Kawashima ............. B23Q 1/58
                                                         198/860.3
2010/0206102 A1    8/2010  Aso et al.
(Continued)

FOREIGN PATENT DOCUMENTS

CN    101802455 A    8/2010
CN    109424709 A    3/2019
(Continued)

OTHER PUBLICATIONS

International Search Report for PCT/JP2020/045507 dated Mar. 9, 2021.

*Primary Examiner* — Charlee J. C. Bennett
(74) *Attorney, Agent, or Firm* — Chrisman Gallo Tochtrop LLC

(57) ABSTRACT

A linearly moving mechanism includes an internal moving body provided within a case body and configured to be moved in a linear direction, the internal moving body being configured to move an external moving body connected to a connection member protruded from the case body through an opening formed at the case body; a seal belt extending in the linear direction and provided within the case body to close the opening, a first surface side of both end portions of the seal belt in a widthwise direction thereof facing an edge portion of the opening while being spaced apart therefrom; and a deformation suppressing member provided to face a second surface side of the both end portions to suppress (Continued)

deformation of the seal belt, the seal belt being connected to the internal moving body to be moved along with a movement of the internal moving body.

5 Claims, 27 Drawing Sheets

(56) References Cited

U.S. PATENT DOCUMENTS

| | | | |
|---|---|---|---|
| 2013/0166064 A1* | 6/2013 | Maki | G06F 17/00 |
| | | | 700/230 |
| 2020/0347926 A1 | 11/2020 | Wang et al. | |
| 2023/0056038 A1* | 2/2023 | Ide | H01L 21/67173 |

FOREIGN PATENT DOCUMENTS

| | | | |
|---|---|---|---|
| JP | 2002305230 A | * | 10/2002 |
| JP | 2004-084824 A | | 3/2004 |
| JP | 2011-208804 A | | 10/2011 |
| JP | 2005101080 A | * | 4/2015 |

* cited by examiner

LINEARLY MOVING MECHANISM AND METHOD OF SUPPRESSING PARTICLE SCATTERING

CROSS-REFERENCE TO RELATED APPLICATIONS

This Application is a U.S. national phase application under 35 U.S.C. § 371 of PCT Application No. PCT/JP2020/045507 filed on Dec. 7, 2020, which claims the benefit of Japanese Patent Application Nos. 2019-223916 and 2020-197365 filed on Dec. 11, 2019 and Nov. 27, 2020, respectively, the entire disclosures of which are incorporated herein by reference.

TECHNICAL FIELD

The various aspects and embodiments described herein pertain generally to a linearly moving mechanism and a method of suppressing scattering of particles.

BACKGROUND

A substrate processing apparatus for manufacturing a semiconductor performs various kinds of processings such as a film forming processing and a resist film developing processing on a semiconductor wafer (hereinafter, simply referred to as a wafer) used as a substrate by supplying various kinds of chemical liquids such as a resist. Such a substrate processing apparatus includes, for example, a moving mechanism for a transfer arm configured to transfer the wafer or a nozzle configured to supply the chemical liquid. The moving mechanism for the transfer arm or the nozzle is equipped with a linearly moving mechanism configured to linearly move a moving target such as a wafer holder and the nozzle.

An example of the linearly moving mechanism is described in, for example, Patent Document 1 which discloses a configuration including an evacuable case, a linearly moving mechanism configured to linearly move a moving member back and forth within the case, a slit formed at the case, and a sealing member (seal belt) configured to seal the slit from the inside of the case. It is described in Patent Document 1 that a part of the moving member is protruded out through the aforementioned slit to be connected to the moving target, and the case is provided with a vent hole allowing the inside and the outside of the case to communicate with each other to suppress a local pressure rise within the case caused by the movement of the moving member while the moving member is moved.

PRIOR ART DOCUMENT

Patent Document 1: Japanese Patent Laid-open Publication No. 2002-305230

SUMMARY

In an exemplary embodiment, a linearly moving mechanism includes a case body allowed to be evacuated; an opening formed at the case body; an internal moving body provided within the case body, and configured to be moved in a linear direction; a connection member provided at the internal moving body to be protruded from the case body through the opening, connected to an external moving body at an outside of the case body, and configured to move the external moving body along with a movement of the internal moving body; a seal belt extending in the linear direction and provided within the case body to close the opening, a first surface side of both end portions of the seal belt in a widthwise direction thereof facing an edge portion of the opening while being spaced apart therefrom; and a deformation suppressing member provided to face a second surface side of the both end portions of the seal belt in the widthwise direction thereof in order to suppress deformation of the seal belt, the seal belt being connected to the internal moving body to be moved in the linear direction along with the movement of the internal moving body, or a suctioning member provided at the case body, and configured to firmly attach, by sucking the first surface side of the both end portions of the seal belt connected to the internal moving body such that a first portion of the seal belt corresponding to a position of the internal moving body becomes farther from the opening than a second portion of the seal belt different from the first portion in the linear direction, the second portion to the edge portion of the opening.

DETAILED DESCRIPTION

First Exemplary Embodiment

Figure 1:
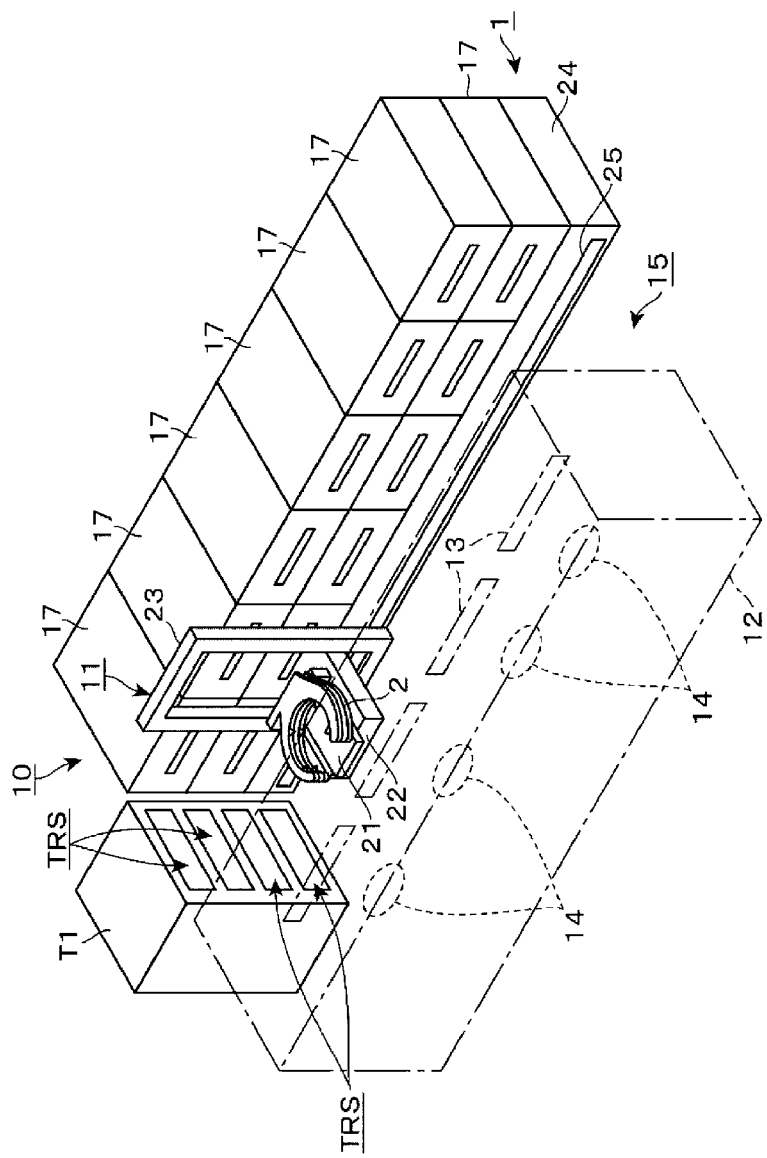
FIG. 1 is a perspective view illustrating a processing unit equipped with a linearly moving mechanism according to a first exemplary embodiment.

As a first exemplary embodiment, an example in which a linearly moving mechanism according to the present disclosure is applied to a transfer arm 11 configured to transfer a wafer W as a substrate for manufacturing a semiconductor will be described. FIG. 1 is a perspective view of a processing unit 10 that is equipped with the transfer arm 11 constituting a substrate transfer mechanism and a module group to which the wafer W is transferred by the transfer arm 11. This processing unit 10 constitutes a coating and developing apparatus which is a substrate processing apparatus to be described later, and is provided in an atmospheric atmosphere. Further, the aforementioned semiconductor does not mean a semiconductor as a substance, but it implies a semiconductor device including an element such as a transistor or diode formed of a semiconductor.

A reference numeral 12 in FIG. 1 is a housing in which a plurality of resist coating modules 14 configured to coat a resist on the wafer W is accommodated, and the housing 12 is provided with transfer openings 13 for the wafer W. The housing 12 faces a transfer path 15 for the wafer W through which the transfer arm 11 is moved, and the resist coating modules 14 are arranged along the lengthwise direction of the transfer path 15. Further, a multiple number of heating modules 17 are disposed along the lengthwise direction of the transfer path 15 so as to face the housing 12 with the transfer path 15 therebetween. The heating modules 17 are vertically stacked on top of each other in two levels to form a stacked body.

A tower T1 is provided at one end side of the transfer path 15 in the lengthwise direction thereof, and transit modules TRS each configured as a module for the carry-in of the wafer W into the processing unit 10 is provided in the tower T1. The transfer arm 11 is configured to transfer the wafer W from the transit module TRS to the resist coating module 14 and the heating module 17 in this order, so that the wafer W is subjected to a resist film formation and a heat treatment in sequence. Then, the transfer arm 11 is configured to transfer the heat-treated wafer W to a transit module TRS (not shown in FIG. 1) for the carry-out of the wafer W from the processing unit 10.

The transfer arm 11 is equipped with two supports 2, a base 21, an elevating table 22, a frame 23, and a case body 24, and is formed by the frame 23 and the case body 24. The supports 2, the base 21, the elevating table 22 and the frame 23 correspond to an external moving body, and a linearly moving mechanism 1 is composed of the case body 24, various components to be described layer, which are configured to move the frame 23 included in the case body 24, and a fan configured to evacuate the case body 24.

Each support 2 supports a rear surface of the wafer W. The two supports 2 are provided on the base 21 to be vertically stacked on top of each other, and are configured to be moved back and forth on the base 21 independently from each other. The base 21 is provided on the elevating table 22, and is configured to be rotatable about a vertical axis on the elevating table 22. The elevating table 22 is provided so as to be surrounded by the frame 23 extending in a vertical direction, and is configured to be moved up and down within the frame 23. The frame 23 is configured to be horizontally movable as will be described later. The wafer W can be transferred between the modules by the operations of the supports 2, the base 21, the elevating table 22 and the frame 23 in cooperation.

Figure 2:
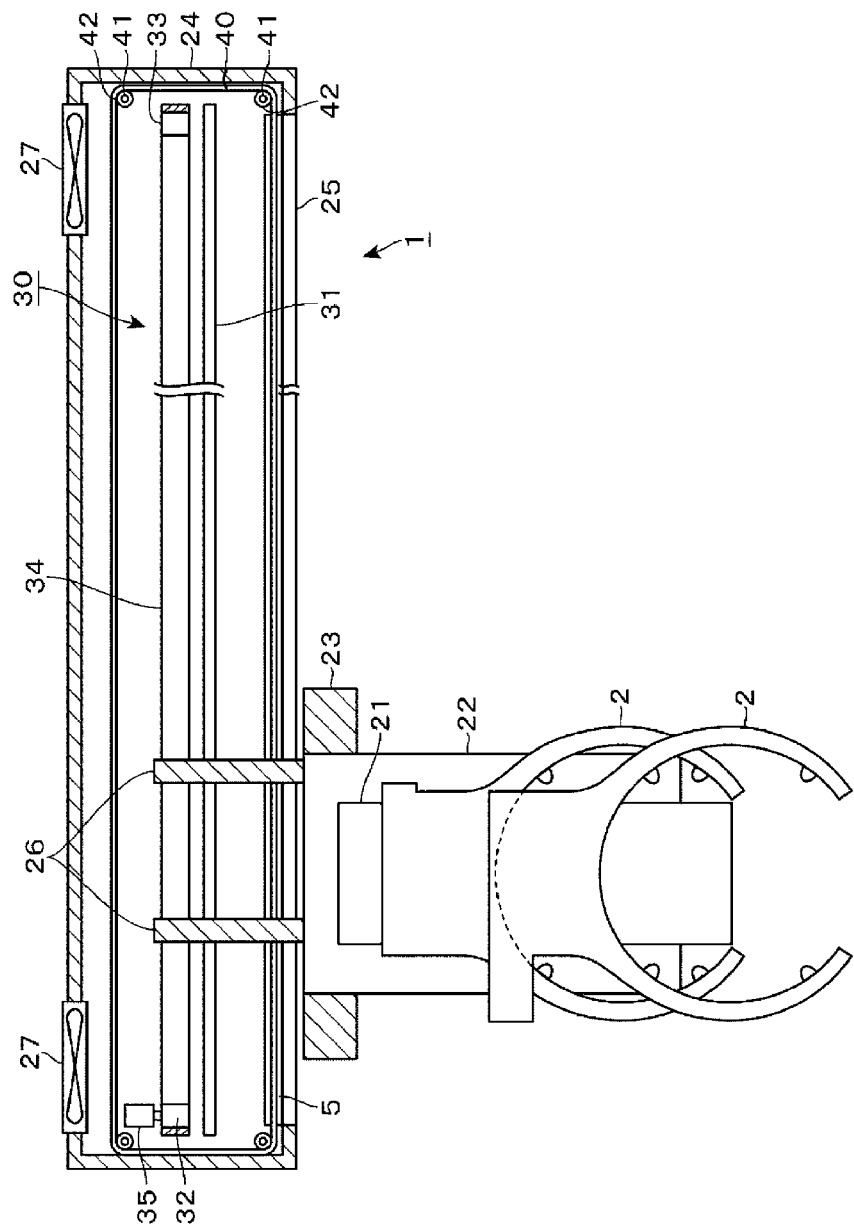
FIG. 2 is a transversal plan view of the linearly moving mechanism according to the first exemplary embodiment.
Figure 3:
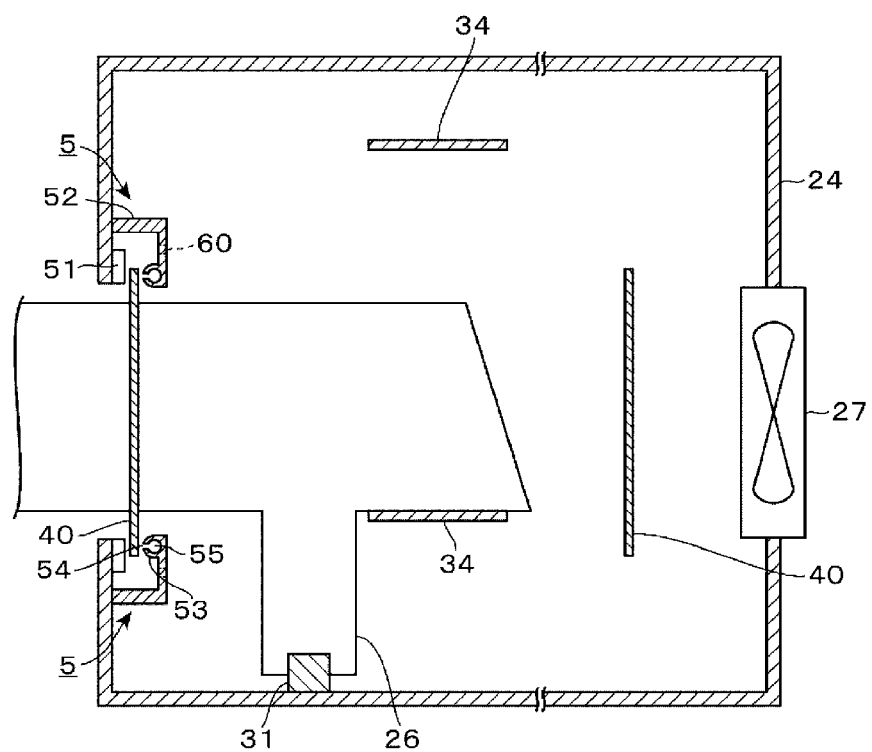
FIG. 3 is a longitudinal side view of the linearly moving mechanism according to the first exemplary embodiment.

Now, the case body 24 will be described with reference to FIG. 2 and FIG. 3 as well. The case body 24 has a rectangular shape, and is disposed below the stacked body of the heating modules 17 so as to extend in an arrangement direction of the stacked bodies. An opening 25 is provided at a side surface of the case body 24 facing the transfer path 15. The opening 25 is formed in a straight line shape so as to extend in a horizontal direction which is the lengthwise direction of the case body 24. Hereinafter, the opening 25 side of the case body 24 will be defined as a front side, and the inside of the case body 24 seen from the opening 25 will be defined as a rear side.

A moving body (internal moving body) 26 is provided within the case body 24. A front end portion of the moving body 26 is protruded from the case body 24 through the opening 25. This front end portion serves as a connection member, and is connected to the frame 23 and supports it. A moving mechanism 30 configured to operate the moving body 26 and the frame 23 is provided inside the case body 24. The moving mechanism 30 is equipped with a guide rail 31 extending along the lengthwise direction of the case body 24, and the moving body 26 is engaged with this guide rail 31.

Further, the moving mechanism 30 includes a driving pulley 32, a driven pulley 33, a belt 34, and a motor 35. The driving pulley 32 and the driven pulley 33 are provided at one end side and the other end side within the case body 24 in the lengthwise direction thereof, and are configured to be rotatable about horizontal axes in parallel. The belt 34 is wound around these pulleys 32 and 33, and this belt 34 is connected to the moving body 26. The motor 35 is connected to the driving pulley 32. The belt 34 is driven by the rotation of the motor 35, and the moving body 26 is moved linearly (in the lengthwise direction of the case body 24) along the opening 25. Along with this movement of the moving body 26, the frame 23 is linearly moved along the lengthwise direction of the transfer path 15.

Fans 27 configured to evacuate the case body 24 are provided on the rear side of the case body 24. For example, the fans 27 are respectively provided at one end side and the other end side within the case body 24 in the lengthwise direction thereof, and the inside of the case body 24 is set into a negative pressure with respect to the transfer path 15 by the operation of these fans 27. Particles generated by sliding movements of the individual components of the moving mechanism 30 and particles generated from grease used in the motor 35 are removed by these fans 27.

Further, in order to suppress the particles in the case body 24 from scattering to the transfer path 15, there is provided a seal belt 40 that closes the opening 25 from the inside. As shown in FIG. 3, the seal belt 40 is an annular belt having a width larger than the width of the opening 25 in an up-and-down direction. As depicted in FIG. 2, driven rollers 42, which are configured to be rotatable, are provided around the four corners within the case body 24, when viewed from the top. A rotation axis 41 of each driven roller 42 extends in the vertical direction. The aforementioned seal belt 40 is tightly wounded around the four driven rollers 42, and one surface side (front surface side) of two opposites end portions of the seal belt 40 in the widthwise direction thereof faces an edge portion of the opening 25 while being spaced apart therefrom. To be more specific, the front surface side of each end portion faces a front wall forming member 51 provided at the edge portion of the opening 25, as will be elaborated later.

The above-described moving body 26 penetrates the seal belt 40 that closes the opening 25. Thus, the moving body 26 is connected to the seal belt 40, and when the moving body 26 is linearly moved by the moving mechanism 30, the seal belt 40 is moved around along a substantially rectangular trajectory within the case body 24, and a portion of the seal belt 40 facing the opening 25 is linearly moved along the lengthwise direction of the case body 24. In this way, although the seal belt 40 is moved along with the moving body 26, the opening 25 is kept closed by the portion of the seal belt 40 that is located between the two driven rollers 42 on the front side, regardless of the position of the moving body 26.

In addition, in the following specification, a surface of the seal belt 40 facing the opening 25 will be defined as one surface side (front surface side), and a surface opposite thereto and in contact with the driven roller 42 will be defined as the other surface side (rear surface side). Further, in the following description, unless a portion of the seal belt 40 is not particularly specified, it is assumed that the seal belt 40 refers to a portion of the perimeter of the seal belt 40 that is tightly wound on the front side (the portion tightly wound between the driven rollers 42 on the front side).

Figure 4:
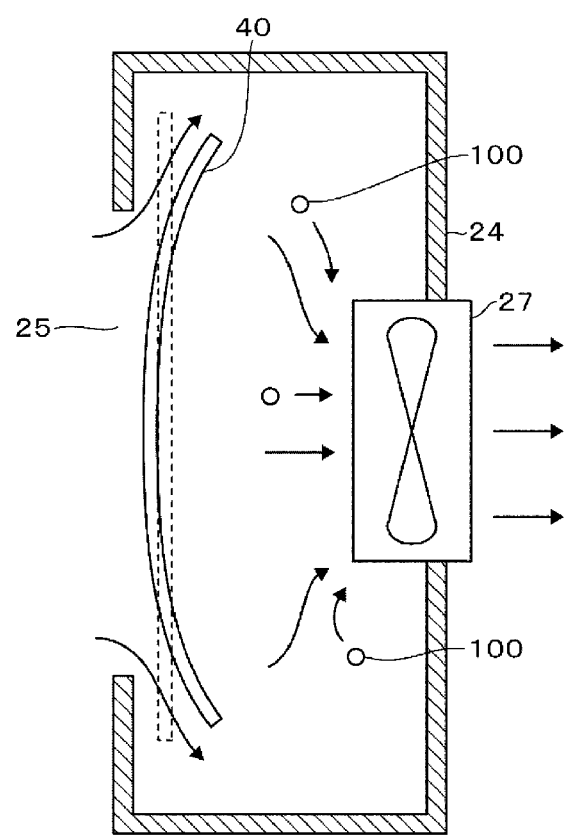
FIG. 4 is an explanatory diagram illustrating an operation of a conventional linearly moving mechanism.

As described in Background, as a conventional linearly moving mechanism, there is known a device including a fan configured to evacuate a case body so that particles included in an atmosphere within the case body may not be scattered to the outside of the case body through an opening of the case body, and including a seal belt at the opening. Now, a case where this conventional linearly moving mechanism is applied to, for example, the transfer arm 11 will be described with reference to FIG. 4 and FIG. 5. Since it is the conventional linearly moving mechanism, an enclosing member 50 to be described later for suppressing deformation of the seal belt 40 is not provided in the case body 24 shown in FIG. 4 and FIG. 5.

Due to the evacuation by the fans 27, the inside of the case body 24 is turned into a negative pressure with respect to the transfer path 15, and air in the transfer path 15 is introduced into the case body 24 through the opening 25. Due to the introduction of the air, the two opposite end portions of the seal belt 40 in the widthwise direction (vertical direction) are pushed toward the rear side of the case body 24, and the seal belt 40 is deformed to be bent in an arc shape when viewed from the side, resulting in enlargement of gaps between the edge portion of the opening 25 of the case body 24 and both end portions of the seal belt 40 in the widthwise direction. Further, in FIG. 4, a solid line indicates the seal belt 40 bent as stated above, and a dashed line indicates the seal belt 40 which is not bent.

Figure 5:
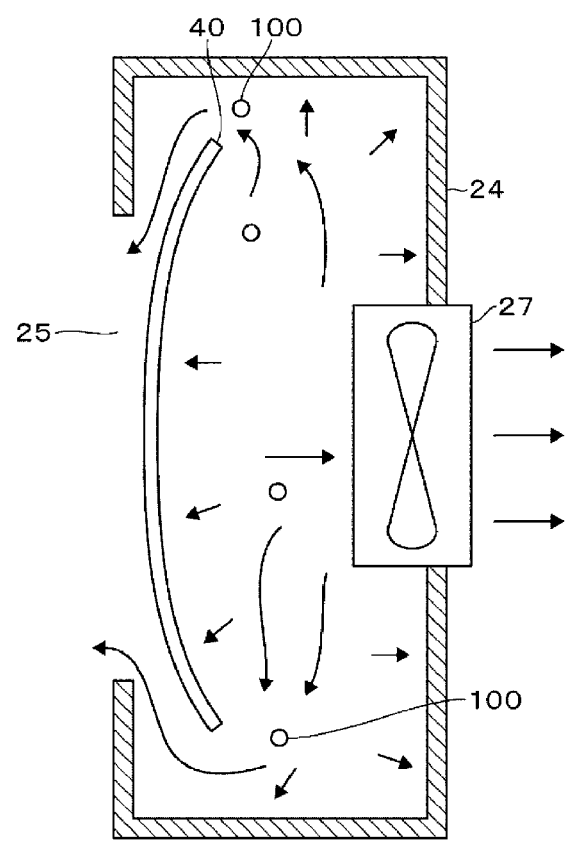
FIG. 5 is an explanatory diagram illustrating the operation of the conventional linearly moving mechanism.

Meanwhile, when the moving body 26 is moved within the case body 24, an atmosphere in an area, which is a moving destination of the moving body, within the case body 24 in the lengthwise direction is compressed by the moving body 26, resulting in a pressure rise. At this time, if the seal belt 40 is deformed as described above and the gaps between the edge portion of the opening 25 of the case body 24 and both end portions of the seal belt 40 in the widthwise direction on the front surface side thereof is widened, there is a likelihood that the compressed atmosphere may flow out of the case body 24 from the gaps, as illustrated in FIG. 5. In such a case, particles 100 in the case body 24 may be scattered into the transfer path 15 by being carried on the flow of the atmosphere.

Thus, in the present exemplary embodiment, in order to suppress the enlargement of the gaps between the edge portion of the opening 25 and both end portions (upper and lower end portions) of the seal belt 40 in the widthwise direction thereof, enclosing members 5 respectively enclosing the upper end portion and the lower end portion of the seal belt 40 are provided. That is, two enclosing members 5 in total are provided on the upper end side and the lower end side of the seal belt 40, respectively. The enclosing member 5 provided on the upper end side of the seal belt 40 and the enclosing member 5 provided on the lower end side thereof are mirror-symmetrically configured with respect to a horizontal plane passing through the center of the seal belt 40. Hereinafter, the enclosing member 5 provided on the upper end side of the seal belt 40 will be described as an example.

The enclosing member 5 is formed by an upper periphery portion of the opening 25 of the case body 24, the front wall forming member 51 provided at the corresponding periphery portion, and a deformation suppressing member 52 configured to suppress the deformation of the seal belt 40. When viewed from a moving direction of the seal belt 40 (that is, the lengthwise direction of the case body 24), the enclosing member 5 is formed as a recess portion surrounding the end portion of the seal belt 40 in the widthwise direction. The front wall forming member 51 is a rectangular member that protrudes backwards from the case body 24 and is elongated along the lengthwise direction of the opening 25, and this front wall forming member 51 is extended from one end of the opening 25 to the other end in the lengthwise direction thereof. A lower end of the front wall forming member 51 is on a level with the upper periphery of the opening 25, and a height of an upper periphery of the front wall forming member 51 is higher than an upper periphery of the seal belt 40. The front wall forming member 51 forms a front sidewall of the recess portion, and faces the front surface of the upper end of the seal belt 40 with a gap therebetween. In this way, the front wall forming member 51 is configured to adjust a size of the gap formed on the front side of the end portion of the seal belt 40 in the widthwise direction so that required sealing property of the seal belt 40 is acquired. The front wall forming member 51 is made of, for example, UPE (Ultra High Molecular Weight Polyethylene).

Now, the deformation suppressing member 52 will be described. The deformation suppressing member 52 has a horizontal wall 50A and a vertical wall 50B. The horizontal wall 50A is provided so as to protrude backwards from a position on an inner wall of the case body 24 slightly above the front wall forming member 51. A rear end of this horizontal wall 50A is bent downwards to form the vertical wall 50B. A portion of the vertical wall 50B in a range of, e.g., approximately 6 mm from a lower end thereof protrudes forwards, forming a protrusion 53 along the lengthwise direction of the opening 25. A front end portion of the protrusion 53 is opposed to an upper end portion of a rear surface of the seal belt 40 with a gap therebetween. Further, the protrusion 53 is formed to have a circular shape when viewed from the moving direction of the seal belt 40. In this way, the deformation suppressing member 52 forms a bottom portion and a rear sidewall of the recess portion, and is made of, for example, UPE, the same as the front wall forming member 51. The use of the UPE is to reduce a friction generated between the seal belt 40 and the deformation suppressing member 52 when the seal belt 40 comes into contact with the deformation suppressing member 52, but the material of the deformation suppressing member 52 is not limited to the UPE. Further, in order to obtain the proper sealing property by the seal belt 40, the size of the gap between the front surface of the seal belt 40 and the front wall forming member 51 is in a range from, e.g., 0.5 mm to 1.0 mm. Furthermore, in order to obtain a proper action of a gas discharged from the protrusion 53 as will be described later, the gap between the rear surface of the seal belt 40 and the protrusion 53 is, for example, 0.5 mm or less.

In addition, in order to suppress the deformation in the entire region of the seal belt 40 facing the opening 25, the deformation suppressing member 52 is formed along the lengthwise direction of the case body 24 from one end of the opening 25 to the other end thereof, for example. That is, in the lengthwise direction of the opening 25, the position of one end of the deformation suppressing member 52 is the same as the position of the one end of the opening 25, or is a position outside the opening 25. Further, the position of the other end of the deformation suppressing member 52 is the same as the position of the other end of the opening 25, or a position outside the opening 25.

Further, if the seal belt 40 and the vertical wall 50B of the deformation suppressing member 52 are rubbed against each other when the moving body 26 and the seal belt 40 are moved, the deterioration of the seal belt 40 may be accelerated, or the particles 100 may be generated. In order to suppress these problems, a gas discharge opening 54 through which, for example, a nitrogen gas ($N_2$ gas) is discharged toward the rear surface side of the seal belt 40 is provided at a front end of the protrusion 53 on the vertical wall 50B. Through the discharge of the gas, a contact between the vertical wall 50B and the seal belt 40 is suppressed.

Figure 7:
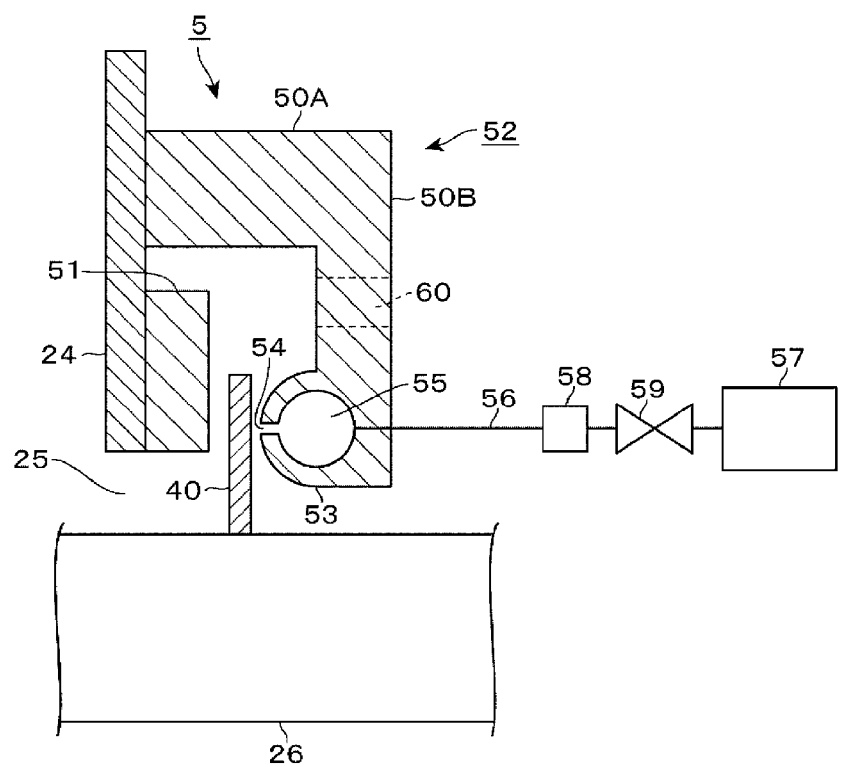
FIG. 7 is a cross sectional view of the enclosing member.

The gas discharge opening 54 is formed in a slit shape extending along the moving direction of the seal belt 40, and is formed from one end of the opening 25 to the other end thereof, for example. The gas discharge opening 54 communicates with a buffer space 55 formed within the protrusion 53. The buffer space 55 is a space for diffusing the gas in the extension direction of the deformation suppressing member 52 (that is, the lengthwise direction of the case body 24), and when viewed from this extension direction, the buffer space 55 is formed to have a circular shape having a diameter of 4 mm. A pipeline constituting a gas supply path 56 through which the $N_2$ gas as a contact suppressing gas is supplied into the buffer space 55 is connected to the deformation suppressing member 52, and an upstream side of the pipeline is connected to an $N_2$ gas source 57. Reference numerals 58 and 59 in FIG. 7 denote a flow rate controller and a valve, respectively.

Further, at a position above the protrusion 53 on the vertical wall 50B (a position at a bottom side of the recess portion when viewed from the lengthwise direction of the case body 24), a vent hole 60 is formed along the thickness direction of the vertical wall 50B. As the inside of the case body 24 is turned into the negative pressure with respect to the transfer path 15 as described above, the air flown into the case body 24 from the transfer path 15 through the opening 25 passes through the vent hole 60 to be exhausted toward the rear side of the case body 24. The number of this vent hole 60 is plural, and the plurality of vent holes 60 are equi-spaced along the extension direction of the deformation suppressing member 52, for example.

Although detailed description of the enclosing member 5 on the lower side will be omitted here as the two enclosing members 5 are mirror-symmetrical as stated above, differences from the enclosing member 5 on the upper side will be briefly explained. The enclosing member 5 on the lower side is formed by a lower periphery portion of the opening 25 of the case body 24. The front wall forming member 51 provided at the lower periphery portion of the opening 25 faces the front surface of the lower end of the seal belt 40. Further, an upper end of this front wall forming member 51 is on a level with a lower end periphery of the opening 25 and is located higher than a lower periphery of the seal belt 40. Moreover, the deformation suppressing member 52 of the enclosing member 5 on the lower side is different from the deformation suppressing member 52 of the enclosing member 5 on the upper side in that the horizontal wall 50A is provided below the front wall forming member 51, the vertical wall 50B is formed upwards from the horizontal wall 50A, and a front end of the protrusion 53 faces a lower end portion of the rear surface of the seal belt 40.

Further, a configuration of the respective components constituting the external moving body of the transfer arm 11 will be further described. The same as the movement of the frame 23, the movement of the supports 2 on the base 21 and the upward/downward movement of the elevating table 22 are also performed by driving systems each composed of a guide rail 31, pulleys 32 and 33, a belt 34 and a motor 35. The driving system of the supports 2 is provided within the base 21, and the driving system of the elevating table 22 is provided within the frame 23. Further, the rotation of the base 21 on the elevating table 22 is also performed by a driving system composed of a motor 35, and this driving system is provided within the elevating table 22. Spaces in which these driving systems are provided communicate with a space within the case body 24 to be evacuated by the fans 27. Here, illustration of the respective driving systems and the spaces where those driving systems are provided is omitted.

Figure 8:
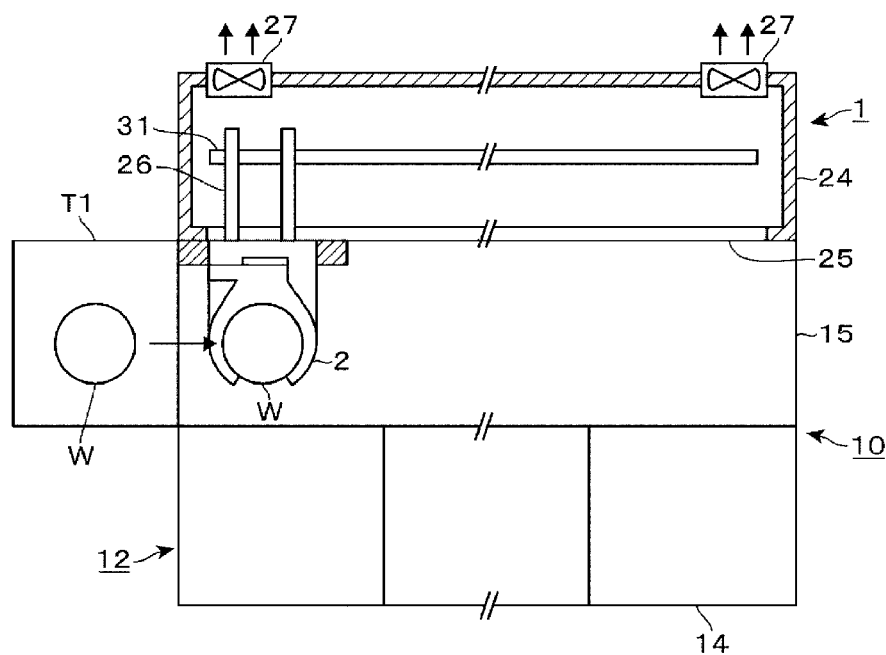
FIG. 8 is an explanatory diagram illustrating an operation of the linearly moving mechanism according to the first exemplary embodiment.

Now, an operation of the above-described transfer arm 11 will be explained. First, before starting a transfer of the wafer W, the transfer arm 11 stands by at a position where the transfer arm 11 receives the wafer W from the transit module TRS of the tower T1, for example. Thus, within the case body 24, the moving body 26 is located near the transit module TRS, as illustrated in FIG. 8. At this time, since the fans 27 are being rotated, the atmosphere including the particles 100 within the case body 24 is being exhausted, and the $N_2$ gas is being discharged from the gas discharge opening 54 toward the rear surface of the seal belt 40.

Figure 9:
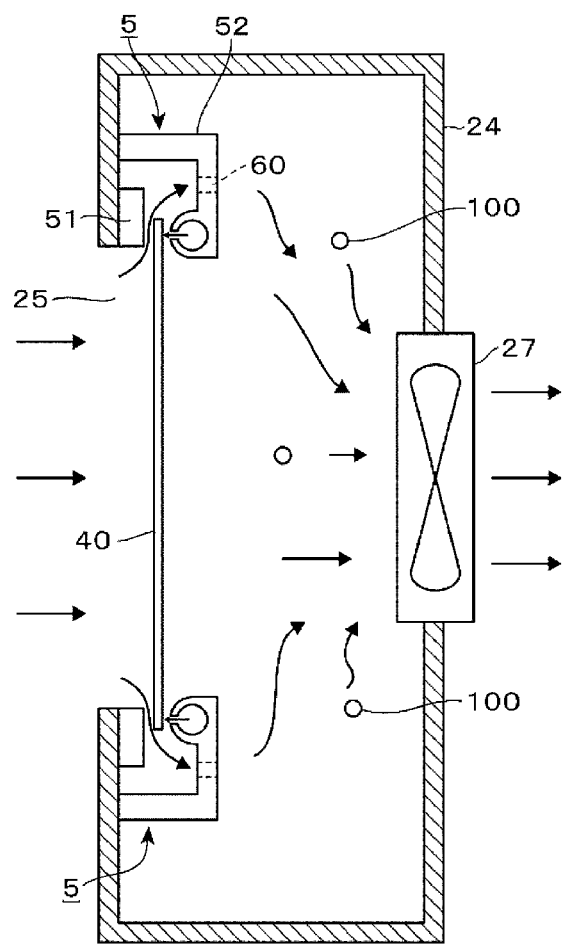
FIG. 9 is an explanatory diagram for describing an air flow within a case body.
Figure 10:
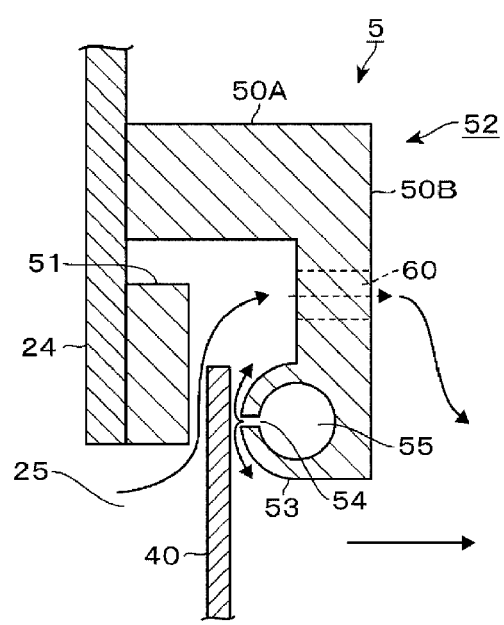
FIG. 10 is an explanatory diagram for describing an air flow near the enclosing member.

Due to the evacuation by the fans 27, the inside of the case body 24 is set into the negative pressure. As shown in FIG. 9 and FIG. 10, the air flows from the transfer path 15 into the opening 25, and this air passes through the gap between the seal belt 40 and the front wall forming member 51 and the vent holes 60 formed at the deformation suppressing member 52 in sequence, and is flown toward the fans 27 to be exhausted. Further, some of the $N_2$ gas discharged from the gas discharge opening 54 to the seal belt 40 flows along a surface of the protrusion 53 toward the bottom side of the recess portion formed by the enclosing member 5 to join the flow of the air passing through the vent holes 60, and then flows toward the fans 27 through the vent holes 60 to be exhausted. Some of the $N_2$ gas discharged to the seal belt 40 flows along the surface of the protrusion 53 toward an opening side of the recess portion, and then flows toward the fans 27 from a space between the upper and lower enclosing members 5 to be exhausted.

The two opposite end portions of the seal belt 40 in the widthwise direction thereof are pushed to the rear side by the above-described air flow. However, since the $N_2$ gas is discharged from the rear side, the backward movement of both end portions in the widthwise direction, that is, the deformation of the seal belt 40 described above with reference to FIG. 4 and FIG. 5 is suppressed. Further, even when the seal belt 40 is deformed as the action by this air flow is relatively strong, the two opposite end portions of the seal belt 40 in the widthwise direction thereof are in contact with the protrusions 53, so that the amount of the deformation thereof is reduced. Therefore, the gaps between both end portions of the seal belt 40 in the widthwise direction and the front wall forming member 51 (the edge portion of the opening 25) are not enlarged.

Figure 11:
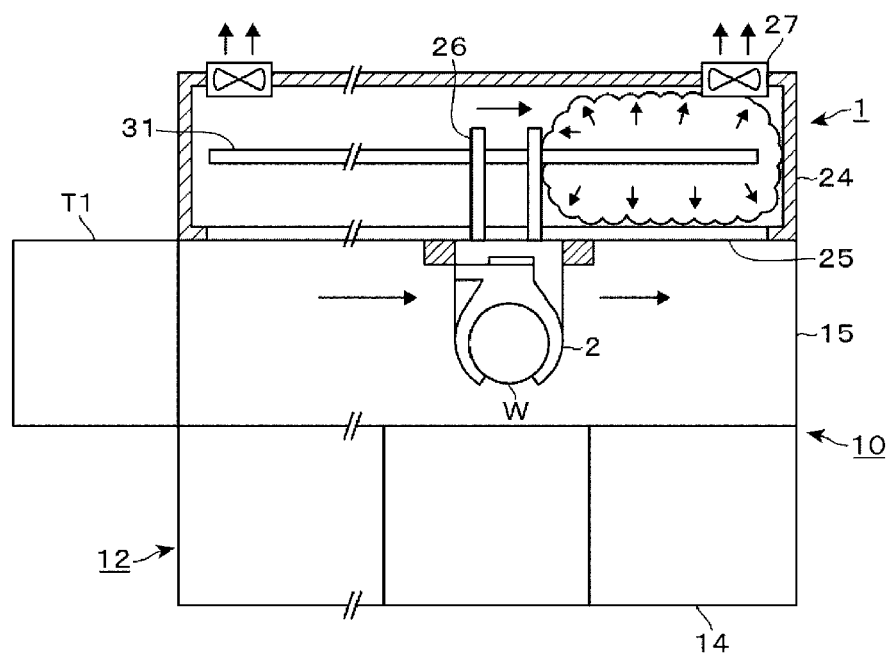
FIG. 11 is an explanatory diagram illustrating an inside of the case body when a transfer arm is moved.

In such a state that the deformation of the seal belt 40 is suppressed, the transfer arm 11 receives the wafer W from the transit module TRS of the tower T1, and transfers the received wafer W to, for example, the innermost resist coating module 14 when viewed from the tower T1, and the moving body 26 is moved from the front side to the inner side when viewed from the tower T1, as illustrated in FIG. 11. Accordingly, the atmosphere of the space (inner space) in the moving direction of the moving body 26 within the case body 24 is compressed, resulting in a pressure rise.

Figure 12:
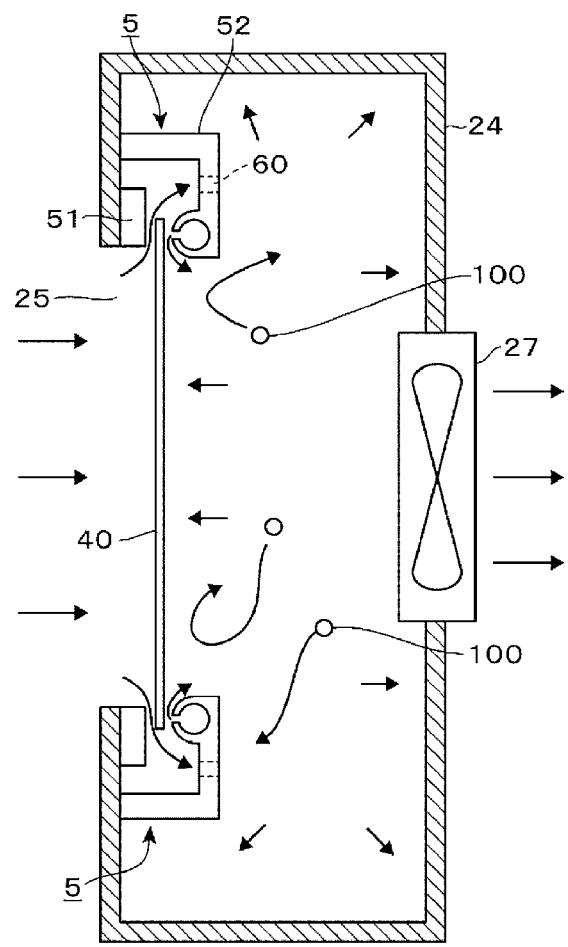
FIG. 12 is an explanatory diagram illustrating an air flow within the case body when the transfer arm is moved.

However, since the deformation of the seal belt 40 is suppressed as stated above, the gaps between both end portions of the seal belt 40 in the widthwise direction and the front wall forming members 51 are kept narrow. Therefore, release of the compressed atmosphere into the transfer path 15 is suppressed as shown in FIG. 12. Accordingly, the particles 100 are also suppressed from being released into the transfer path 15 from the inside of the case body 24. Here, although the state of the seal belt 40 when the wafer W is transferred from the transit module TRS to the resist coating module 14 has been described as an example, the deformation of the seal belt 40 is also suppressed when the wafer W is transferred between the modules, so that the release of the particles 100 into transfer path 15 is suppressed.

According to this transfer arm 11, in moving the moving body 26 accommodated in the case body 24 to linearly move the frame 23 connected to the moving body 26 through the opening 25, the seal belt 40 for closing the opening 25 is provided. Further, there are provided the enclosing members 5 respectively equipped with the deformation suppressing members 52 facing the other surface side of both end portions of the seal belt 40 in the widthwise direction thereof. Therefore, even when the case body 24 is evacuated by the fans 27, the gaps between both end portions of the seal belt 40 in the widthwise direction and the edge portion of the opening 25 due to the deformation of the seal belt 40 is suppressed from being enlarged. Thus, the scattering of the particles 100 from the inside of the case body 24 to the transfer path 15 through the opening 25 is suppressed. As a result, the adhesion of the particles 100 to the wafer W passing through the transfer path 15 is suppressed, so that the reduction in yield of semiconductor products manufactured from the wafer W can be suppressed.

Further, since the deformation of the seal belt 40 is suppressed and the sealing property of the opening 25 is high, it is possible to suppress the scattering of the particles to the transfer path 15 while reducing the rotation speed of the fans 27. Thus, by reducing the rotation speed of the fans 27, the electric power supplied to the fans 27 can be reduced. Therefore, operating cost of the transfer arm 11 can be reduced.

Further, the $N_2$ gas is discharged from the protrusions 53 provided on the vertical walls 50B of the deformation suppressing members 52 to the rear surface of both end portions of the seal belt 40 in the widthwise direction thereof. Accordingly, the deformation of the seal belt 40 is more reliably suppressed, and the contact of the seal belt 40 with the deformation suppressing members 52 is suppressed. Since the particle generation is suppressed as the contact is suppressed in this way, the scattering of the particles to the transfer path 15 is suppressed more securely. Furthermore, as described above, the deterioration of the seal belt 40 can also be suppressed.

In addition, since the gas discharge opening 54 is formed in the slit shape extending along the moving direction of the seal belt 40, the contact of the seal belt 40 with the deformation suppressing members 52 at respective positions of the seal belt 40 along the lengthwise direction of the opening 25 can be suppressed as described above, which is deemed to be desirable. However, as the gas discharge opening 54, a plurality of small-diameter discharge openings may be formed at a certain distance therebetween along the moving direction of the seal belt 40. When the gas discharge opening 54 is formed in the slit shape as well, a plurality of slit-shaped discharge openings may be formed at a certain distance therebetween.

Further, the gas discharge opening 54 is provided at the protrusion 53 of the vertical wall 50B constituting the deformation suppressing member 52, and the $N_2$ gas is discharged from a position relatively close to the seal belt 40. Accordingly, a pressure applied from the gas to the seal belt 40 can be relatively increased. Further, on the vertical wall 50B, since portions other than the protrusion 53 at which the gas discharge opening 54 is formed as described above are relatively far from the seal belt 40, it is difficult for these portions to come into contact with the seal belt 40. That is, by discharging the gas from the protrusion 53, the contact between the seal belt 40 and the deformation suppressing member 52 can be more securely suppressed, which is regarded as being desirable.

In addition, since the protrusion 53 has the circular shape when viewed from the moving direction of the seal belt 40, the $N_2$ gas discharged from the gas discharge opening 54 flows along the surface of the protrusion 53 toward the fans 27 without being stayed. Accordingly, it is possible to suppress the front side of the seal belt 40 from coming into contact with the front wall forming member 51 because of an increase of a pressure on the rear surface side of the seal belt 40 caused by the staying of the $N_2$ gas discharged to the rear surface side of the seal belt 40. In addition, since the protrusion 53 is of such a circular shape, even when the protrusion 53 comes into contact with the seal belt 40, generated friction may be relatively small, so that the deterioration of the seal belt 40 and the generation of particles 100 may be suppressed. Thus, it is desirable that the protrusion 53 has the circular shape.

Furthermore, in the vertical wall 50B of the deformation suppressing member 52, the vent hole 60 is provided at the position on the bottom side of the recess portion formed by the enclosing member 5. As the air flowing from the transfer path 15 into the opening 25 flows to the rear side of the case body 24 through this vent hole 60, the amount of the air passing through the gap between the protrusion 53 and the seal belt 40 is reduced. That is, the flow of the air in such a way to traverse the $N_2$ gas flow discharged from the gas discharge opening 54 is suppressed, so that the decrease of the pressure of the $N_2$ gas flow on the seal belt 40 is suppressed. Therefore, the contact between the seal belt 40 and the deformation suppressing member 52 is more reliably suppressed.

As will be described later, the linearly moving mechanism 1 of the present disclosure is not limited to being applied to the transfer arm 11. However, each of the elevating table 22, the base 21, and the frame 23 is equipped with the driving mechanism, so they have a relatively large weight. Thus, the connection member of the moving body 26, which is configured to support each of these components and is connected to the frame 23, may need to be relatively large in order to increase the strength. When the moving body 26 is configured in this way, the opening 25 of the case body 24 is widened. If the opening 25 is widened, the area of the seal belt 40 for closing the opening 25 also need to be enlarged. If the area of the seal belt 40 is increased in this way, the seal belt 40 may be loosened, raising a risk that the deformation of the seal belt 40 described above with reference to FIG. 4 and FIG. 5 may easily occur. That is, it is desirable to apply the linearly moving mechanism to the transfer arm 11 because, by doing so, the deformation of the linearly moving mechanism 1 can be suppressed, and the high effect of suppressing the scattering of the particles can be achieved.

Figure 13:
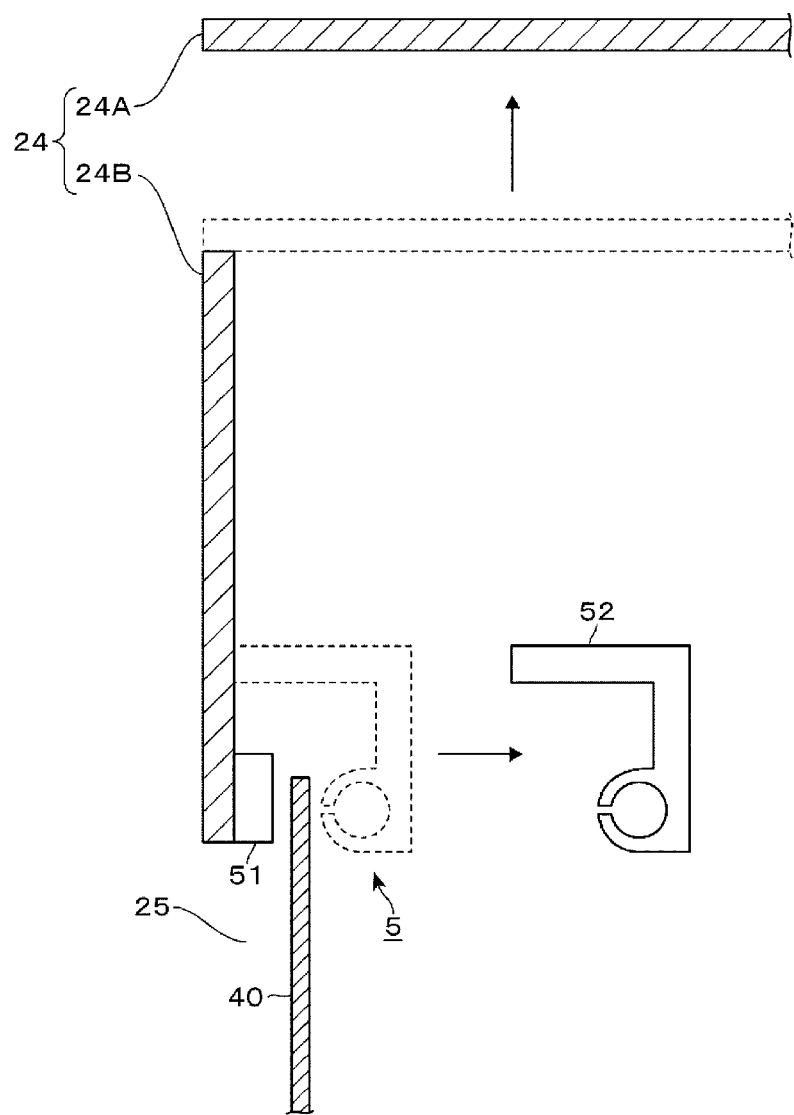
FIG. 13 is an explanatory diagram for describing attachment/detachment of a deformation suppressing member.

Meanwhile, the case body 24 may be disassembled, and the inside thereof can be opened. As a specific example, an upper wall portion of the case body 24 may be configured as a lid 24A to be attached to or detached from another portion (case main body 24B) of the case body 24. As shown in FIG. 13, the deformation suppressing member 52 is configured to be detachable from the case body 24. The deformation suppressing member 52 can be detached from the case main body 24B from which the cover 24A has been separated, and maintenance such as cleaning may be performed. The attachment/detachment of the deformation suppressing member 52 to/from the case body 24 and the attachment/detachment of the lid 24A to/from the case main body 24B may be performed by using, for example a fastening tool (not shown), such as a bolt and a nut.

Now, modification examples of the deformation suppressing member 52 for the seal belt 40 according to the present disclosure will be described, while mainly focusing on differences from the deformation suppressing member 52. Further, in FIG. 14 to FIG. 17 illustrating the modification examples, the front wall forming member 51 forming the recess portion surrounding the seal belt 40 and the horizontal wall 50A forming the deformation suppressing member are simplified, as compared to FIG. 3, for example.

Figure 14:
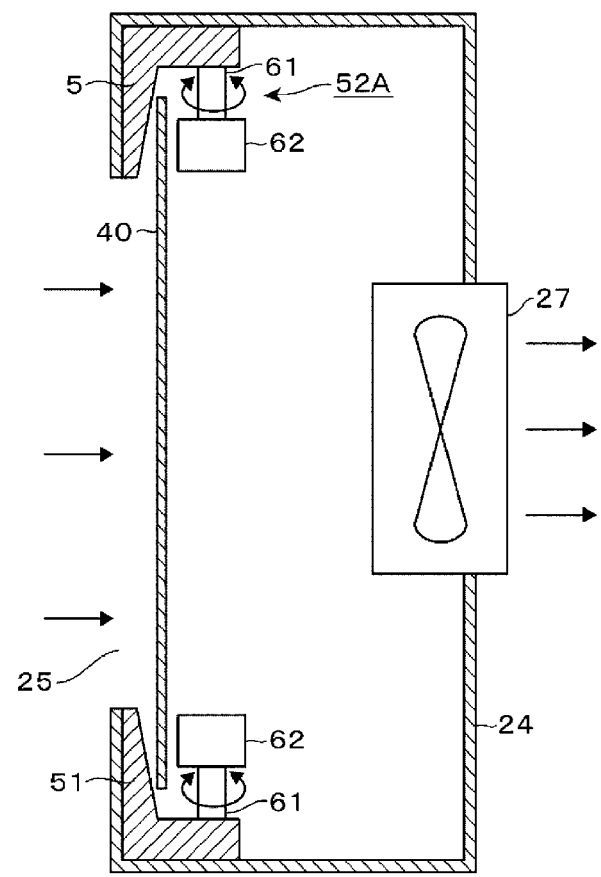
FIG. 14 is a longitudinal side view illustrating another example of the enclosing member.
Figure 15:
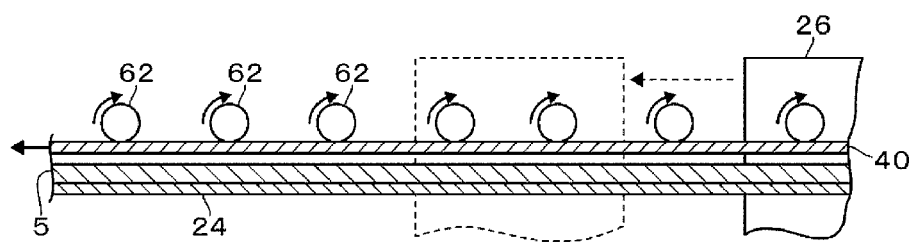
FIG. 15 is a transversal plan view illustrating the another example of the enclosing member.

A deformation suppressing member 52A shown in FIG. 14 is equipped with a shaft 61 and a cam follower 62 which is a column-shaped rotating body uprightly provided, instead of the vertical wall 50B. The shaft 61 is extended from a rear portion of the horizontal wall 50A toward a central portion of the seal belt 40 in the widthwise direction thereof, and the cam follower 62 is provided at an end of the shaft 61 to be rotatable around the shaft 61. Thus, the shaft 61 and the cam follower 62 form a sidewall of the recess portion on the rear side when viewed from the lateral side. The shaft 61 extends along the vertical direction, and thus is orthogonal to the moving direction of the seal belt 40. The shaft 61 and the cam follower 62 may be plural in number, and they may be arranged at, for example, a regular distance therebetween along the moving direction of the seal belt 40, as shown in FIG. 15.

By providing the plurality of cam followers 62 on the rear side of the seal belt 40 in this way, the positions of both end portions of the seal belt 40 in the widthwise direction can be restricted, and the deformation of the seal belt 40 can be suppressed. Furthermore, if a circumferential surface of the cam follower 62 is in contact with the seal belt 40 when the seal belt 40 is moved, the cam follower 62 is rotated in the moving direction of the seal belt 40. Accordingly, friction between the cam follower 62 and the seal belt 40 can be reduced, so that the deterioration of the seal belt 40 and the particle generation are suppressed. In the state that the seal belt 40 is not deformed, the seal belt 40 may be in contact with the circumferential surface of the cam follower 62 or may be slightly apart therefrom.

Figure 16:
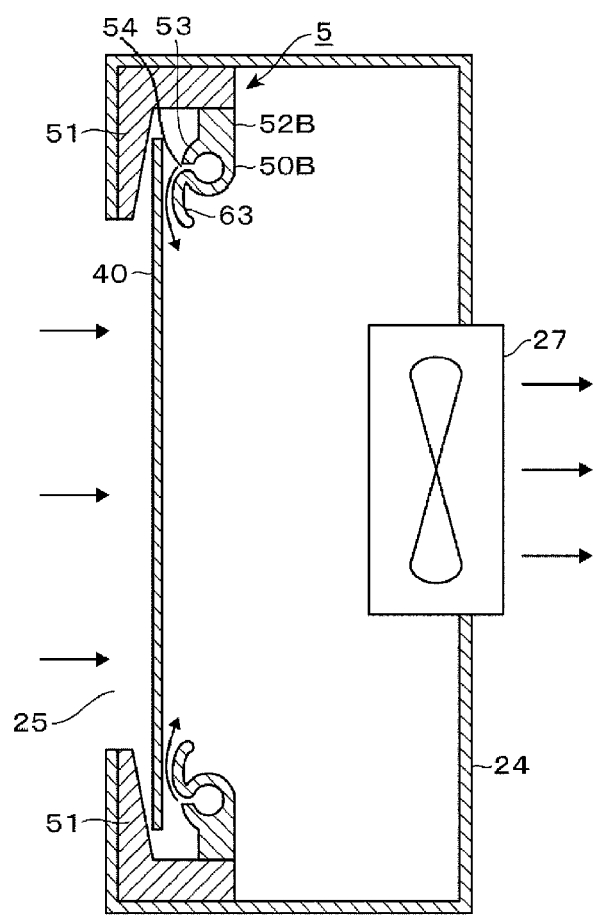
FIG. 16 is a longitudinal side view illustrating yet another example of the enclosing member.

In addition, a deformation suppressing member 52B shown in FIG. 16 is not provided with the vent hole 60 in the vertical wall 50B thereof. Further, the protrusion 53 of this deformation suppressing member 52B is equipped with a plate-shaped airflow guide member 63. The airflow guide member 63 is provided so as to extend from an edge portion of the gas discharge opening 54 of the protrusion 53 toward the central side of the seal belt 40 in the widthwise direction thereof. Since the airflow guide member 63 is extended from the edge portion of the gas discharge opening 54 as described above, it is adjacent to the seal belt 40. The $N_2$ gas discharged from the gas discharge opening 54 and the air flowing into the opening 25 from the transfer path 15 flow through a gap formed between the airflow guide member 63 and the seal belt 40, and is exhausted from the case body 24. In this way, the airflow guide member 63 is a guide portion configured to regulate the airflow by forming a gap with a small front-rear width on the rear side at each of both end portions of the seal belt 40 in the widthwise direction. The airflow flowing through the gap on the rear side of the seal belt 40 in this way generates a vacuum-attracting force according to Bernoulli's principle, and both end portions of the seal belt 40 in the widthwise direction are attracted to the airflow guide members 63 while being kept in non-contact with them. Therefore, the positions of both end portions of the seal belt 40 in the widthwise direction are restricted, so that the deformation of the seal belt 40 is suppressed, and the contact between the seal belt 40 and the protrusion 53 can be more reliably suppressed.

Further, the gas discharge opening 54 and the airflow guide member 63 may be provided at the front wall forming member 51, and both end portions of the seal belt 40 in the widthwise direction may be attracted forwards, keeping them in non-contact with the front wall forming members 51. Alternatively, the gas discharge opening 54 and the airflow guide member 63 may be provided on both the front surface side and the rear surface side of the seal belt 40.

Figure 17:
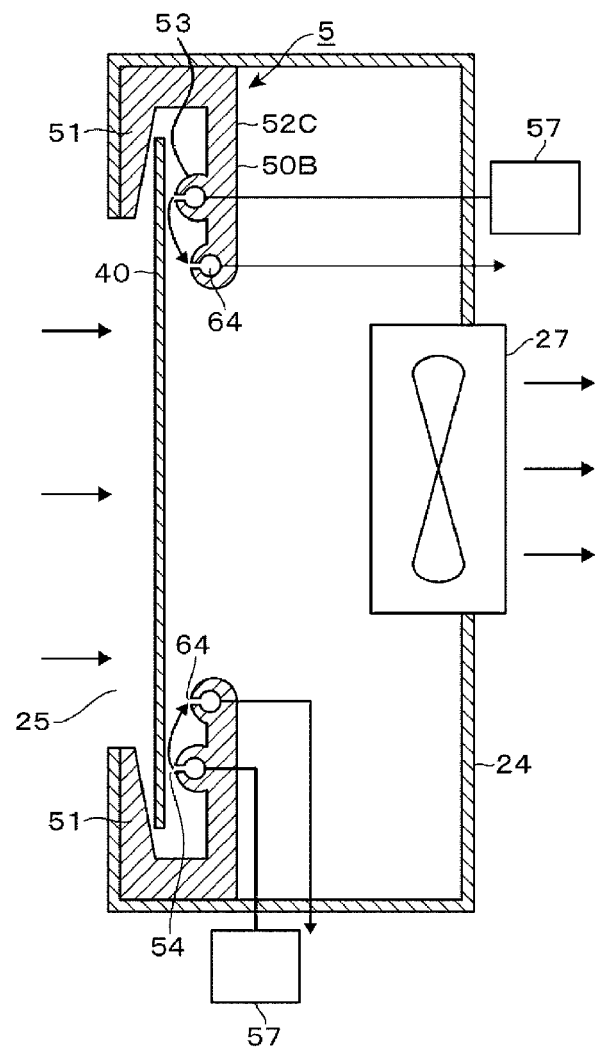
FIG. 17 is a longitudinal side view illustrating still yet another example of the enclosing member.

Now, a deformation suppressing member 52C shown in FIG. 17 will be explained. This deformation suppressing member 52C is not provided with the vent hole 60. An end portion of the vertical wall 50B thereof is extended toward a central portion of the seal belt 40 in the widthwise direction more than the protrusion 53 is. An exhaust path 65 is formed within this extended portion, and a suction opening 64 communicating with the exhaust path 65 is opened on a front surface of this extended portion facing the seal belt 40. Accordingly, the suction opening 64 is located at an opening side of the recess portion with respect to the gas discharge opening 54. Some of the air introduced from the transfer path 15 and the N₂ gas discharged from the gas discharge opening 54 are flown through the suction opening 64 to be exhausted, and some of the air passes through the front of the vertical wall 50B and is flown into the fans 27 to be exhausted. In this way, by performing the suction from the suction opening 64 along with the discharge of the gas from the gas discharge opening 54, an excessive rise of the pressure on the rear surface side of the seal belt 40 due to the N₂ gas discharged from the gas discharge opening 54 can be suppressed. By suppressing such a rise in the pressure on the rear surface side, the seal belt 40 can be suppressed from coming into contact with the front wall forming member 51.

Figure 18:
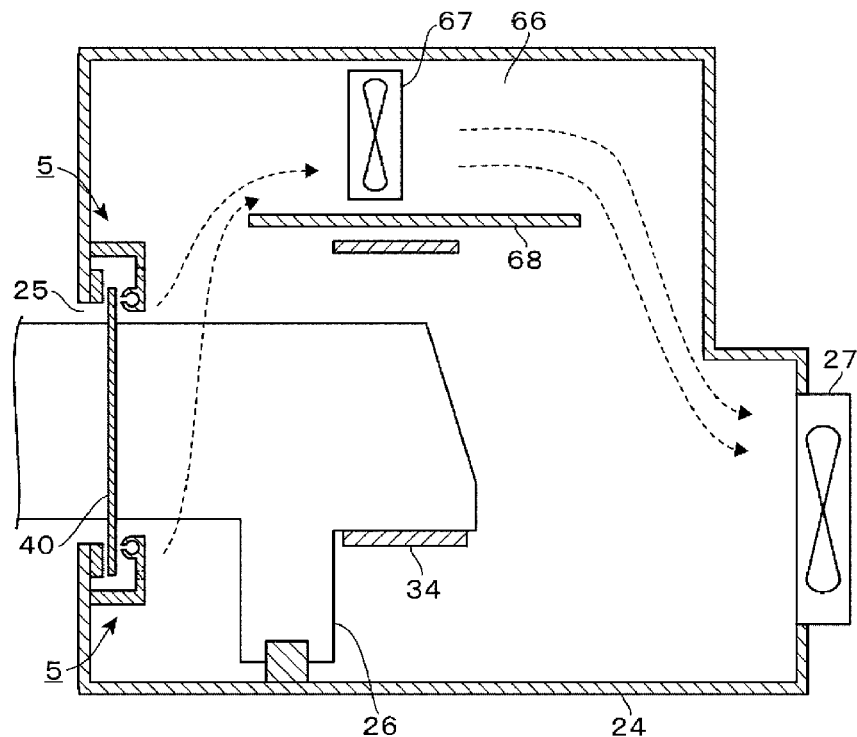
FIG. 18 is a longitudinal side view illustrating another example of the inside of the case body.

Another configuration example of the case body 24 is shown in FIG. 18. A horizontal partition plate 68 is provided in a central portion within the case body 24 of FIG. 18 in a front-rear direction to partition a region (movement region) where the moving body 26 and the belt 34 are moved and a region above it (referred to as a division region 66). A fan 67 is provided in this division region 66 separately from the fan 27. The air introduced into the case body 24 from the opening 25 flows into the division region 66 by the fan 67, and is exhausted by the fan 27 toward the rear side of the division region 66. That is, there is formed an exhaust path bypassing the region in which the moving body 26 is moved. By adopting this configuration, the number of the particles 100 in the movement region of the moving body 26 is reduced. Thus, even if the pressure of the atmosphere is raised in this movement region by the movement of the moving body 26 and, thus, the atmosphere flows toward the opening 25, the number of particles 100 included in the atmosphere is small. Therefore, the scattering of the particles 100 to the transfer path 15 can be suppressed more reliably.

Second Exemplary Embodiment

Figure 19:
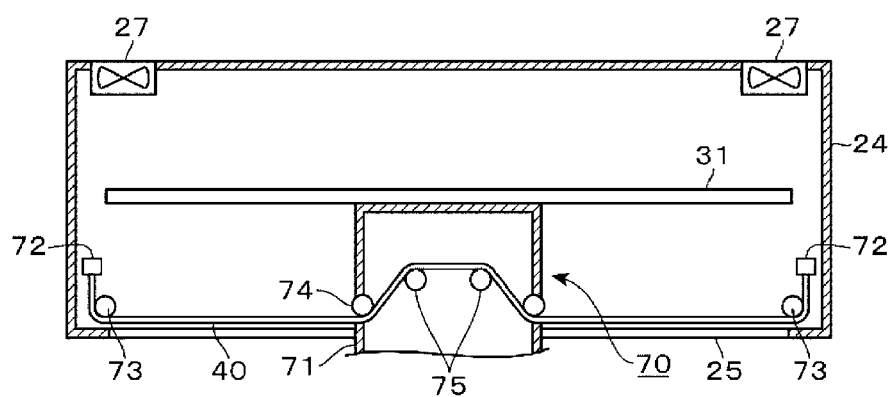
FIG. 19 is a transversal plan view of a linearly moving mechanism according to a second exemplary embodiment.

A linearly moving mechanism according to a second exemplary embodiment will be described. As shown in FIG. 19, the linearly moving mechanism according to the second exemplary embodiment includes an internal moving body 70 configured to be linearly moved along the guide rail 31 provided in the case body 24. The internal moving body 70 corresponds to the moving body 26 of the first exemplary embodiment, and is configured to be horizontally moved by individual members provided within the case body 24, such as a motor 35 and a belt 34, the same as the moving body 26. Illustration of these individual members is omitted here.

A height dimension of the internal moving body 70 is larger than a width dimension of the opening 25 and a width dimension of the seal belt 40, and a periphery of an upper end and a periphery of a lower end on a front surface of the internal moving body 70 respectively faces the edge portions of the opening 25 in the widthwise direction thereof. Further, in front of the internal moving body 70, there is provided a connection member 71 which is connected to a non-illustrated external moving body and protruded from the opening 25 to the outside of the case body 24.

Inside the case body 24, the seal belt 40 is disposed so that one surface side of both end portions of the seal belt 40 in the widthwise direction thereof faces the edge portion of the opening 25 of the case body 24 while being spaced apart therefrom. The seal belt 40 is provided so as to penetrate the internal moving body 70. In the second exemplary embodiment, the seal belt 40 is not of an annular shape. Two opposite ends of the seal belt 40 in the lengthwise direction are respectively fixed to supporting columns 72 within the case body 24, and the seal belt 40 is disposed to close the opening 25. A reference numeral 73 in FIG. 19 denotes a driven roller configured to regulate the position of the seal belt 40 so that the seal belt 40 is tightly extended near the opening 25, and these driven rollers 73 are disposed outside the opening 25 in the lengthwise direction of the opening 25.

Further, within the internal moving body 70, outer driven rollers 74 are respectively provided near both sidewalls facing the moving direction of the internal moving body 70 (the lengthwise direction of the case body 24). The outer driven rollers 74 have a function of regulating the position of the seal belt 40 such that the seal belt 40 passes near the opening 25 at the outside of the internal moving body 70, and are provided near the opening 25. Further, within the inner moving body 70, there are provided two driven rollers 75 configured to regulate the position of the seal belt 40 such that the seal belt 40, which penetrates through the inside of the internal moving body 70, passes through a position apart from the opening 25. These two driven rollers 75 are located on the rear side of the outer driven rollers 74, and arranged apart from each other in the lengthwise direction of the case body 24. Further, a rotation axis of each of the rollers 73 to 75 extends in the vertical direction.

That is, in this second exemplary embodiment, the internal moving body 70 is moved with respect to the seal belt 40. The seal belt 40 is wound around the rollers 74 and 75 of the internal moving body 70 such that front and rear positions of respective portions of the seal belt 40 in the lengthwise direction thereof, which corresponds to the internal moving body 70 in the case body 24, are changed. To be specific, a portion (first portion) of the seal belt 40 positioned inside the internal moving body 70 is located on the rear side, and a portion (second portion) positioned outside the internal moving body 70 is located on the front side, that is, near the opening 25.

Figure 20:
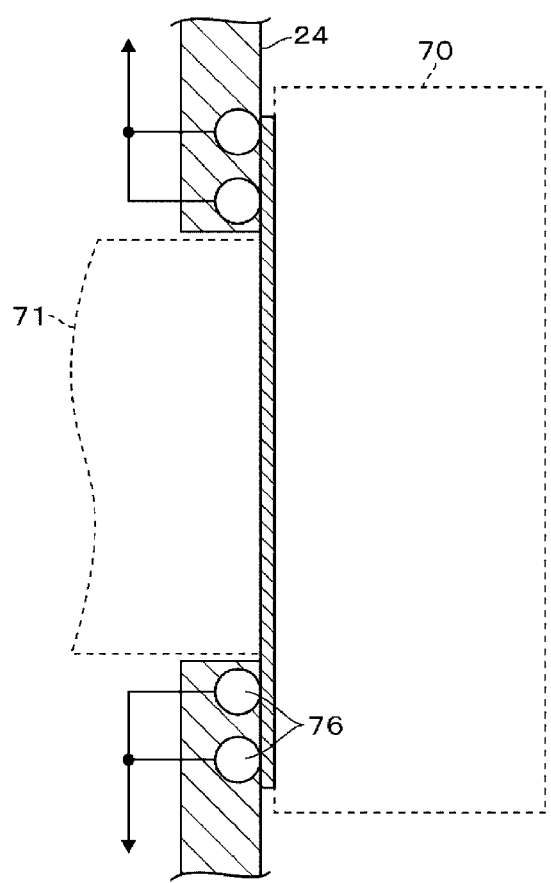
FIG. 20 is an explanatory diagram illustrating an operation of the linearly moving mechanism according to the second exemplary embodiment.

Moreover, as shown in FIG. 20, suction holes 76 are opened toward the rear side at an upper periphery portion and a lower periphery portion of the opening 25 on an inner surface of the case body 24. In this example, the suction holes 76 are respectively formed at the upper and lower periphery portions in two levels. At each of the upper and lower periphery portions, a plurality of suction holes 76 are provided at a distance therebetween along the lengthwise direction of the opening 25. The suction holes 76 are configured as a suctioning member configured to suck a front surface side of both end portions of the seal belt 40 in the widthwise direction thereof, and serve to allow portions of the seal belt 40 located outside the internal moving body 70 to be firmly attached to the edge portion of the opening 25.

Figure 21:
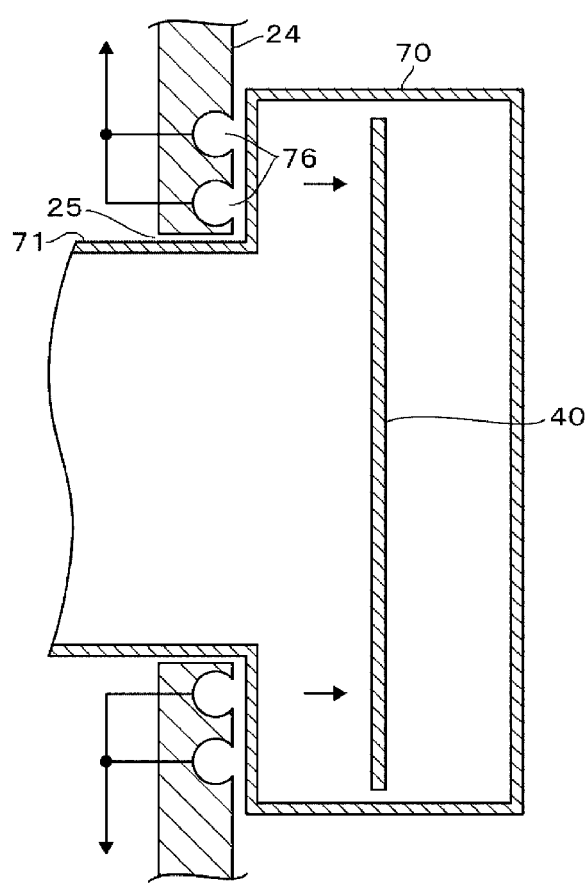
FIG. 21 is an explanatory diagram illustrating the operation of the linearly moving mechanism according to the second exemplary embodiment.

When the internal moving body 70 is moved, a portion of the seal belt 40 that enters the internal moving body 70 is distanced apart from the edge portion of the opening 25 by a stress applied thereto due to the movement of the internal moving body 70, as shown in FIG. 21. Meanwhile, a portion of the seal belt 40 that comes out of the internal moving body 70 is positioned near the opening 25 and sucked by the suction holes 76 to be firmly attached to the edge portion of the opening 25, as depicted in FIG. 20.

As the seal belt 40 is firmly attached in this way, even when the case body 24 is evacuated into the negative pressure, the seal belt 40 that closes the opening 25 is not drawn to the rear side of the case body 24. Accordingly, gaps between the periphery of both ends of the seal belt 40 in the widthwise direction and the edge portion of the opening 25 are not enlarged. Therefore, even when the pressure within the case body 24 is increased due to the movement of the internal moving body 70, it is possible to suppress the atmosphere including the particles 100 from being flowing to the outside of the case body 24.

The suction hole 76 may be a horizontally long slit. Further, the suctioning member configured to suck the seal belt 40 to the case body 24 is not limited to the above-described structure. For example, there may be adopted a configuration in which a periphery portion of the seal belt 40 in the widthwise direction includes a metal, and a magnet is disposed at the edge portion of the opening 25 of the case body. A portion of the seal belt 40 located near the opening 25 at the outside of the internal moving body 70 may be firmly attracted to the edge portion by the magnetic force of the magnet. That is, the present disclosure is not limited to the configuration in which the seal belt 40 is sucked by the evacuation.

Third Exemplary Embodiment

Figure 22:
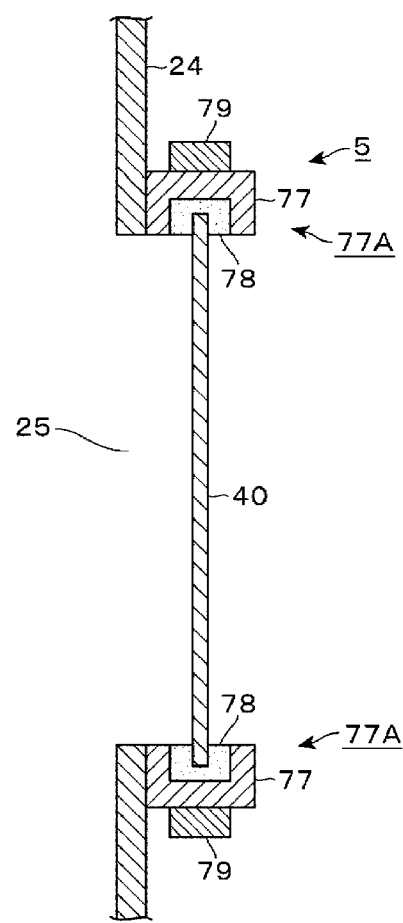
FIG. 22 is a longitudinal side view illustrating an enclosing member of a linearly moving mechanism according to a third exemplary embodiment.

A linearly moving mechanism according to a third exemplary embodiment will be explained, while focusing on differences from the linearly moving mechanism 1 according to the first exemplary embodiment. The linearly moving mechanism 1 according to the third exemplary embodiment is different from the linearly moving mechanism 1 according to the first exemplary embodiment in the configuration of the enclosing member 5. As illustrated in FIG. 22, the enclosing member 5 of the linearly moving mechanism according to the third exemplary embodiment includes holding tools 77 extending along the lengthwise direction of the case body 24. A longitudinal cross section of this holding tool 77 forms a recess portion 77A. The two holding tools 77 are arranged such that opening sides of their recess portions 77A face each other. That is, the recess portion 77A of the holding tool 77 on the upper side is opened downwards, and the recess portion 77A of the holding tool 77 on the lower side is opened upwards. Further, the holding tool 77 is provided with an electromagnet 79 on the opposite side to the opening side of the recess portion 77A, that is, at the outside of the recess portion 77A, and the electromagnet 79 is disposed along the lengthwise direction of the holding tool 77 (that is, the lengthwise direction of the case body 24). A magnetic fluid 78 is filled in each recess portion 77A and maintained in the recess portion 77A by a magnetic force of the electromagnet 79. Each of the two ends of the seal belt 40 in the widthwise direction is located within the recess portion 77A and is in contact with the magnetic fluid 78 therein while being kept in non-contact with the holding tool 77.

That is, the gap between the seal belt 40 and the opening 25 is sealed by the magnetic fluid 78. Even in this configuration, since both end portions of the seal belt 40 in the widthwise direction are located in the recess portions 77A, the backward movement of the seal belt 40 is restricted. Further, since the gap is sealed by the magnetic fluid 78 as described above, the scattering of the particles from the case body 24 to the transfer path 15 is more securely suppressed. Further, since the end portion of the seal belt 40 is moved in the magnetic fluid 78, a large frictional force does not act on the end portion of the seal belt 40. As a result, the deterioration of the seal belt 40 and the particle generation as a result of the seal belt 40 being rubbed can be suppressed.

Figure 23:
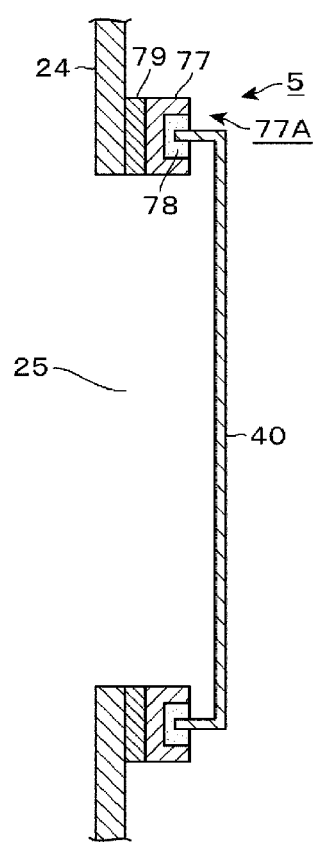
FIG. 23 is a longitudinal side view illustrating another example of the enclosing member of the linearly moving mechanism according to the third exemplary embodiment.

Moreover, as shown in FIG. 23, each holding tool 77 may be disposed such that the recess portion 77A is opened toward the rear side, and both end portions of the seal belt 40 in the widthwise direction may be bent toward the front side to be in contact with the magnetic fluid 78.

Figure 24:
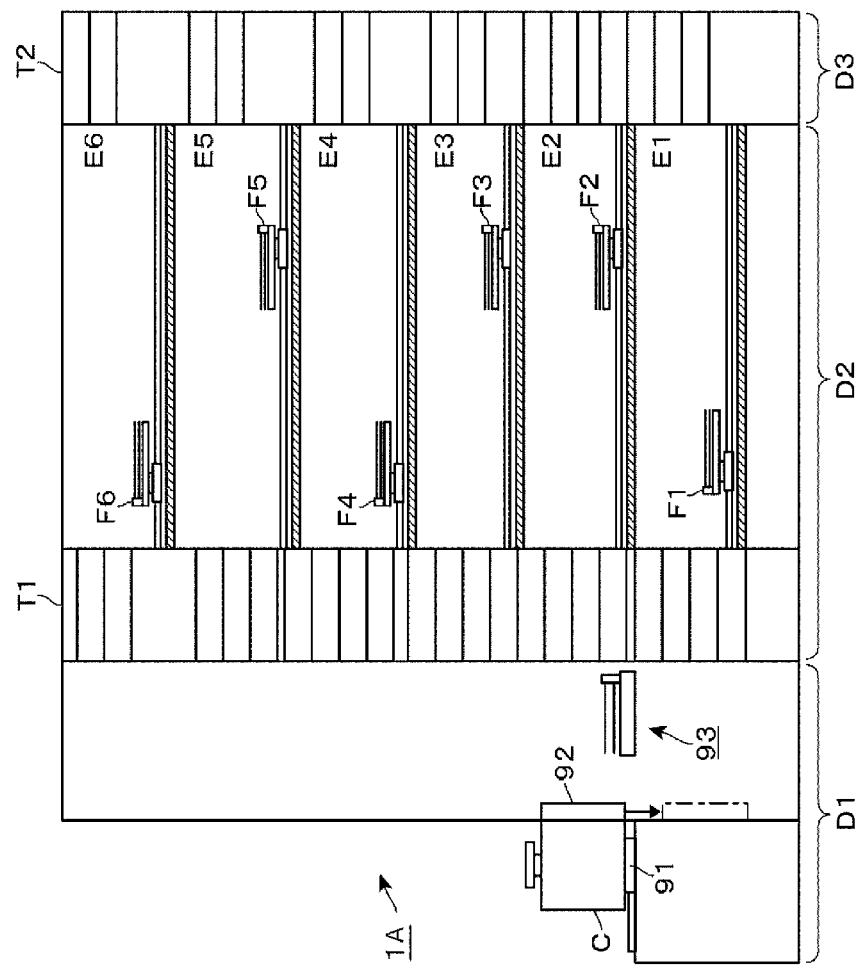
FIG. 24 is a longitudinal cross sectional view illustrating a coating and developing apparatus.
Figure 25:
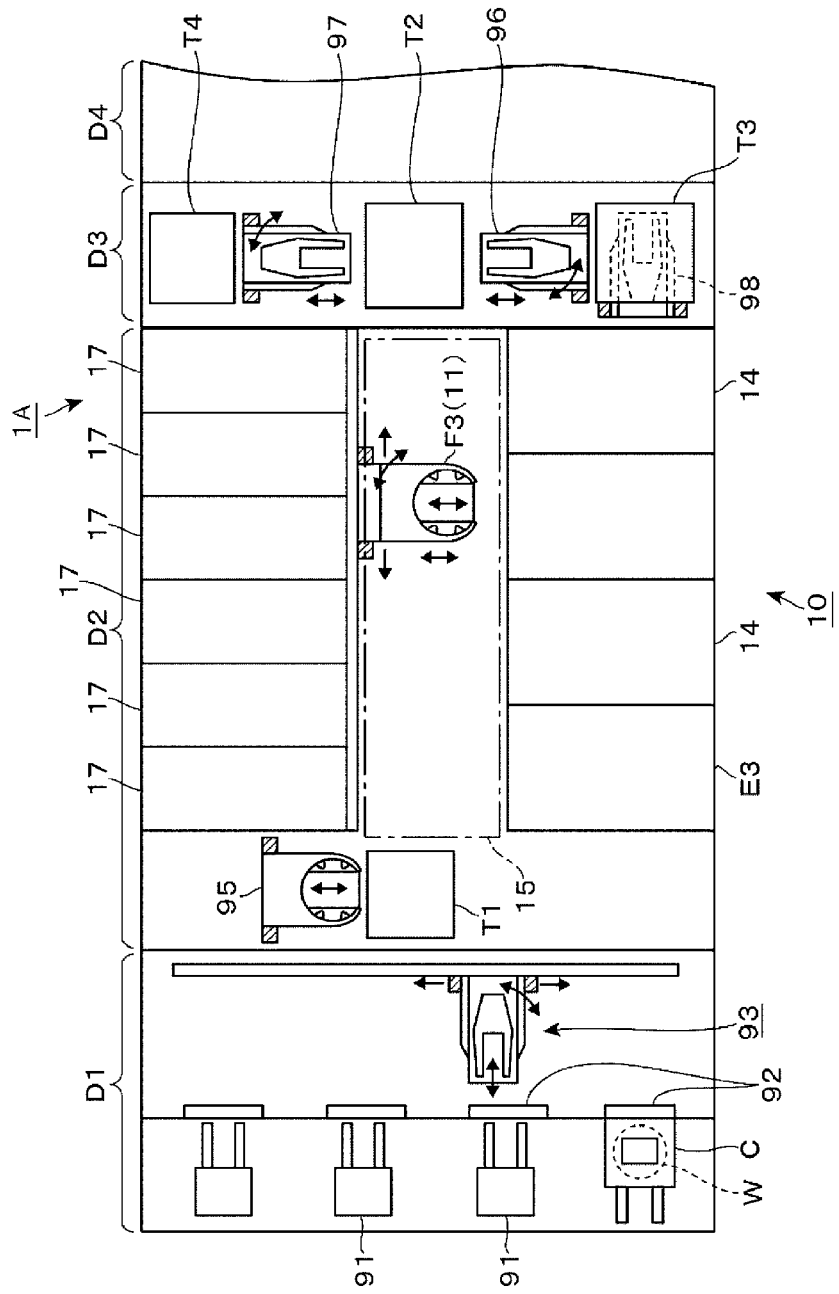
FIG. 25 is a plan view illustrating the coating and developing apparatus.

Now, the coating and developing apparatus 1A in which the processing unit 10 shown in FIG. 1 is disposed will be described in detail. FIG. 24 and FIG. 25 are a schematic longitudinal side view and a plan view of the coating and developing apparatus, respectively. This coating and developing apparatus includes a carrier block D1, a processing block D2 and an interface block D3 connected in sequence in a straight line shape. An exposure apparatus D4 is connected to the interface block D3 on the opposite side from where the processing block D2 is connected. The carrier block D1 has a function of carrying a carrier C into/from the coating and developing apparatus 1A, an opening/closing unit 92 configured to be moved up and down to open or close a lid of the carrier C, and a transfer device 93 configured to transfer the wafer W from the carrier C through the opening/closing unit 92.

In the processing block D2, unit blocks E1 to E6 are stacked in sequence from the bottom. Each of the unit blocks E1 to E3 corresponds to the processing unit 10 described above, and is configured to form a resist film on the wafer W. The unit blocks E4 to E6 have substantially the same configuration as the unit blocks E1 to E3, but each of them is equipped with a developing module instead of the resist coating module 14.

The tower T1 shown in FIG. 1 is provided near the carrier block D1, and is vertically extended along the respective unit blocks E1 to E6. Further, the transit module TRS is provided at each height of the unit blocks E1 to E6. Furthermore, although not shown in FIG. 1, a transfer arm 95 configured to be movable up and down to transfer the wafer W to/from the tower T1 is provided. In addition, in FIG. 24, the transfer arms 11 of the respective unit blocks E1 to E6 are denoted by F1 to F6, respectively.

The interface block D3 includes towers T2, T3, and T4 each vertically extending along the unit blocks E1 to E6. Transfer of the wafer W between the tower T2 and the tower T3 is performed by an interface arm 96 configured to be movable up and down, and transfer of the wafer W between the tower T2 and the tower T4 is performed by an interface arm 97 configured to be movable up and down. Furthermore, an interface arm 98 configured to transfer the wafer W between the tower T2 and the exposure apparatus D4 is also provided. In the tower T2, modules such as transit module TRS are stacked on top of each other. Furthermore, although modules are also provided in each of the towers T3 and T4, description thereof will be omitted here.

In this coating and developing apparatus 1A, the wafer W transferred by the carrier C is transferred to the unit blocks E1 to E3 to be subjected to the resist film formation and the heat treatment in sequence. Then, the wafer W is transferred to the exposure apparatus D4 via the transit module TRS at each height of the unit blocks E1 to E3 of the tower T2 of the interface block D3 to be subjected to an exposure processing. The wafer W after being exposed is transferred to the transit module TRS at each height of the unit blocks E4 to E6 of the tower T2. Subsequently, the wafer W is subjected to heat treatment and a developing processing in sequence in the unit blocks E4 to E6. After a pattern is formed on the resist film, the wafer W is returned back into the carrier C.

The linearly moving mechanism 1 according to the present disclosure may be applied to the opening/closing unit 92 configured to open the lid of the carrier C in the coating and developing apparatus shown in FIG. 24. By applying the linearly moving mechanism according to the present disclosure, it is possible to suppress the release of the particles into the transfer path of the wafer W which is taken out of the carrier C, and, thus, it is possible to suppress the adhesion of the particles to the wafer W.

Further, the linearly moving mechanism according to the present disclosure may also be applied to the resist coating module 14. To elaborate, the linearly moving mechanism may be applied to, for example, a moving mechanism for a nozzle configured to discharge a resist. Hereinafter, description thereof will be provided with reference to FIG. 26. A reference numeral 87 in the figure denotes a cup that surrounds the wafer W to process it.

Figure 26:
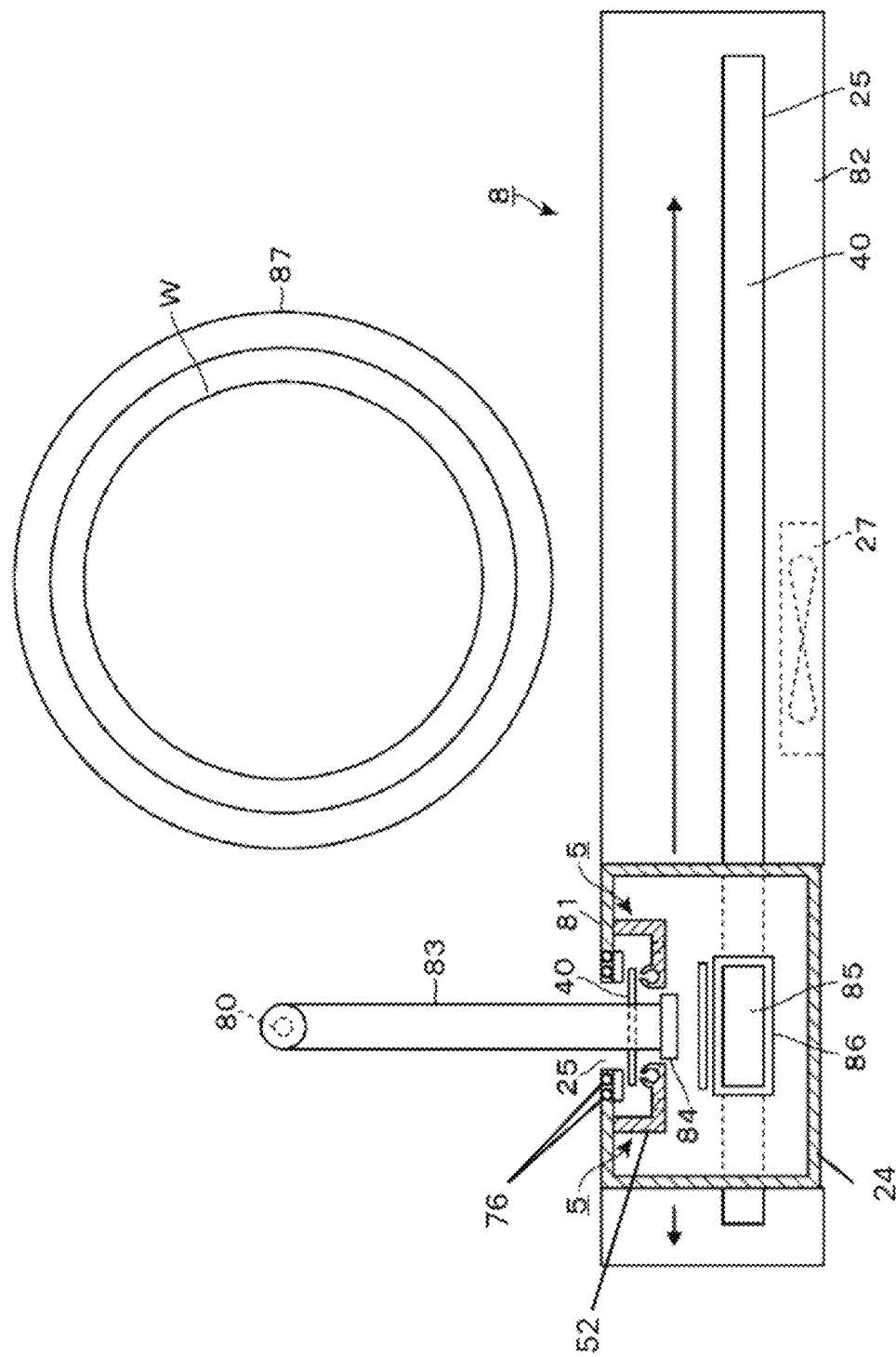
FIG. 26 is a plan view illustrating a coating module to which the linearly moving mechanism of the present disclosure is applied.

As depicted in FIG. 26, a nozzle moving mechanism 8 is equipped with a first housing 81 and a second housing 82 each of which has substantially the same structure as the linearly moving mechanism 1 shown in the first exemplary embodiment. The following description will focus on differences between the first and second housings 81 and 82 and the linearly moving mechanism described in the first exemplary embodiment. In the first housing 81, a nozzle 80 as the external moving body is connected to a moving body 84 as the internal moving body via an arm 83 which is a connection member, and the nozzle 80 is configured to be moved up and down. Further, in the housing 81, an exhaust opening 85 is formed in a bottom surface thereof, instead of providing the fan 27.

The second housing 82 is disposed such that an opening 25 thereof faces upwards, and is configured to move the first housing 81 as the external moving body in the horizontal direction. Further, a connection member 86 which supports the first housing 81 is formed to have a tubular shape, for example. One end of the connection member 86 is connected to the exhaust opening 85 of the first housing 81, and the other end thereof is opened to the inside of the second housing 82. When the evacuation is performed by the fan 27 of the second housing 82, the first housing 81 is also evacuated together through the connection member 86.

By the operation of the nozzle moving mechanism 8, the nozzle 80 is moved between a processing position of a predetermined height for the wafer W inside the cup 87 and a standby position of a preset height outside the cup 87. Since each of the first housing 81 and the second housing 82 has the same configuration as the linearly moving mechanism 1, the scattering of the particles from each housing is suppressed in moving the nozzle 80 as stated above. Therefore, it is possible to suppress the adhesion of the particles to the wafer W.

As stated above, the linearly moving mechanism of the present disclosure is not limited to being applied to the transfer arm 11. The linearly moving mechanism of the present disclosure may also be applicable to a nozzle moving mechanism of an apparatus configured to supply a chemical liquid other than the resist. Besides the aforementioned examples, the linearly moving mechanism of the present disclosure may be applied to, by way of non-limiting example, an elevating mechanism configured to elevate an elevating pin provided to transfer a substrate with respect to a transfer mechanism in an apparatus or a module configured to process the substrate. In addition, this linearly moving mechanism may also be applied to a moving mechanism configured to move a placing table 91 for the carrier C between an unloading position (a position at which the carrier C is transferred onto the placing table 91) and a loading position (a position at which the wafer W is carried into the apparatus). Furthermore, the moving direction of the external moving body by the linearly moving mechanism is not limited to the up-and-down direction and the horizontal direction as in the respective exemplary embodiments described above. By way of example, the moving direction may be an inclined direction.

Further Modification Example of First Exemplary Embodiment

Figure 6:
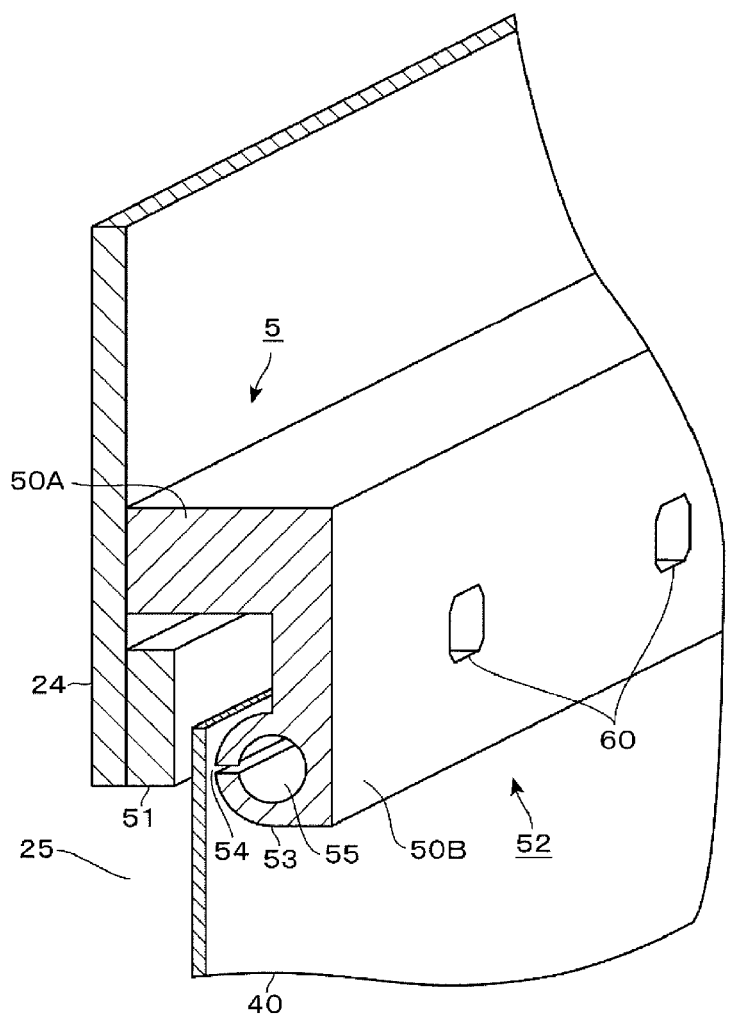
FIG. 6 is a perspective view of an enclosing member provided in the linearly moving mechanism according to the first exemplary embodiment.
Figure 27:
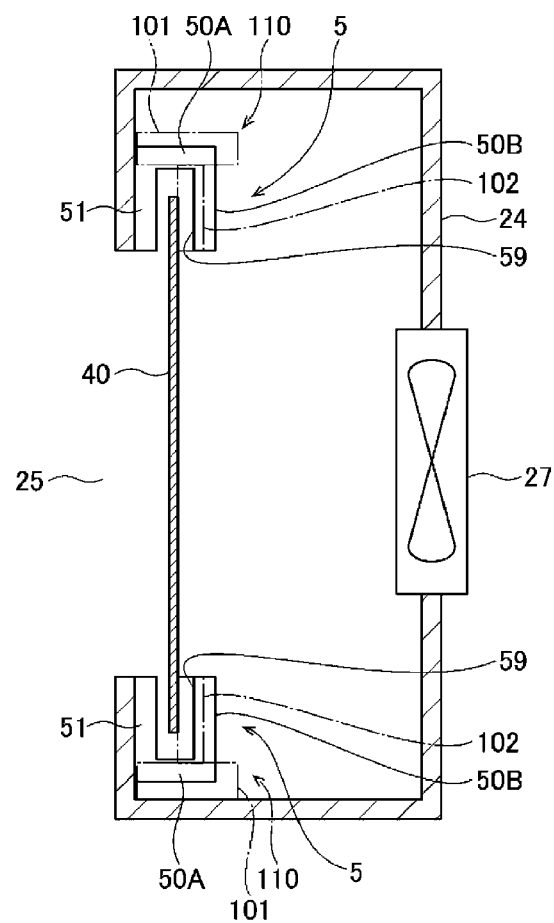
FIG. 27 is a longitudinal side view illustrating another example of the case body.
Figure 28:
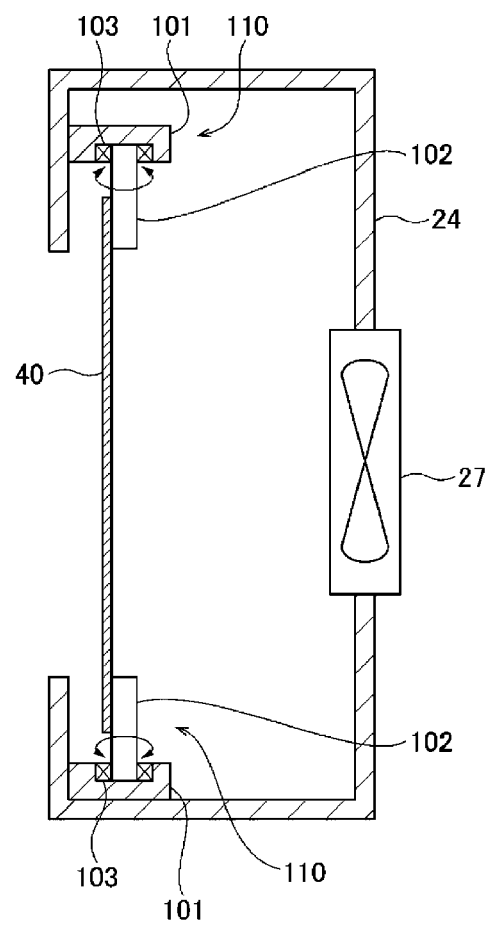
FIG. 28 is a longitudinal side view illustrating the another example of the case body.
Figure 29:
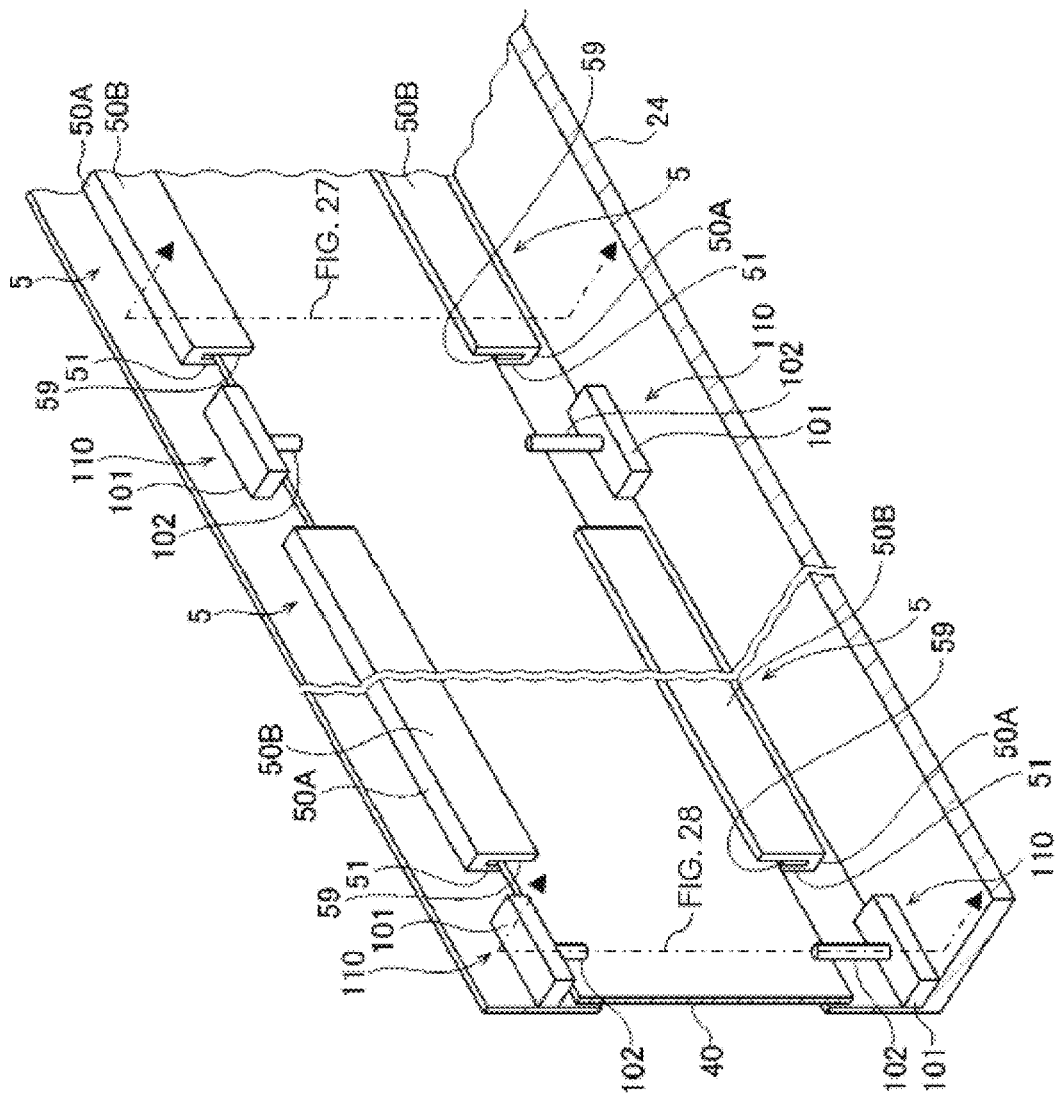
FIG. 29 is a perspective view illustrating the another example of the case body.

Now, a further modification example of the first exemplary embodiment will be described with reference to longitudinal side views of FIG. 27 and FIG. 28 and a perspective view of FIG. 29, focusing on differences from the first exemplary embodiment shown in FIG. 6 and so forth. FIG. 27 and FIG. 28 illustrate cross sections at different positions in the moving direction (linear direction) of the seal belt 40. In this modification example as well, enclosing members 5 each forming a recess portion when viewed in the moving direction of the seal belt 40 are respectively provided at an upper side and a lower side within the case body 24, the same as in the first exemplary embodiment. Hereinafter, the enclosing member 5 on the upper side will be described as a representative example.

The enclosing member 5 in this modification example is a member elongated in the moving direction of the seal belt 40, and is made of, by way of example, a resin. Sidewalls and a bottom wall forming the recess portion are formed as one body. More specifically, the front wall forming member 51 described in the first exemplary embodiment is configured to be connected to the horizontal wall 50A, and the front wall forming member 51, the horizontal wall 50A and the vertical wall 50B form, as one body, the enclosing member 5 as the recess portion. This enclosing member 5 surrounds an upper end portion of the seal belt 40. Further, the vertical wall 50B (the sidewall at one side of the recess portion) of the enclosing member 5 of this modification example is not provided with the protrusion 53 and the vent hole 60, and a front surface of the vertical wall 50B is configured as a vertical surface 59 opposed to and close to the rear surface side (the other surface side) of the upper end portion of the seal belt 40 (that is, provided so as to be slightly distanced apart from the seal belt 40). This enclosing member 5 is plural in number, and the plurality of enclosing members 5 are arranged at the upper side within the case body 24 at a certain distance therebetween in the moving direction of the seal belt 40.

A plurality of roller units 110 is provided at the upper side within the case body 24. Each roller unit 110 is equipped with a base 101 and a roller 102. The base 101 is disposed at a position higher than the upper end of the seal belt 40, and the roller 102 is vertically elongated downwards from the base 101 so that a circumferential surface of this roller 102 faces the rear surface of the upper end portion of the seal belt 40. The roller 102 is a rotating body configured to be rotated around a vertical axis, and an upper end side of the roller 102 is surrounded by a bearing 103 and is connected to the base 101 via the bearing 103. When viewed toward the moving direction of the seal belt 40, a front end of the roller 102 is provided at a position closer to the rear surface of the seal belt 40 rather than the vertical surface 59 of the vertical wall 50B of the above-described enclosing member 5. For example, the front end of the roller 102 is adjacent to or in contact with the rear surface of the seal belt 40. The plurality of roller units 110 are provided above the seal belt 40, and the roller units 110 and the enclosing members 5 are alternately arranged in the moving direction of the seal belt 40. Accordingly, the rollers 102 and the vertical walls 50B are arranged in the moving direction of the seal belt 40.

In this further modification example of the first exemplary embodiment as well, the structure near the opening of the case body 24 is vertically mirror-symmetrical, the same as in the above-described examples. Accordingly, a plurality of enclosing members 5 and a plurality of roller units 110 are provided at the lower side within the case body 24, and these enclosing members 5 and roller units 110 are alternately arranged in the moving direction of the seal belt 40. In this way, the lower end portion of the seal belt 40 is surrounded by the enclosing member 5 at the lower side within the case body 24, and the vertical wall 50B of this enclosing member 5 faces the rear surface of lower end portion of the seal belt 40. Furthermore, the base 101 of the roller unit 110 disposed at the lower side within the case body 24 in this way is located below the lower end of the seal belt 40, and the roller 102 is protruded upwards from the base 101 to face the rear surface of the lower end portion of the seal belt 40. As such, the positional relationship between the vertical wall 50B of the enclosing member 5 and the roller 102 respectively provided at the lower side within the case body 24 is the same as the positional relationship between the vertical wall 50B of the enclosing member 5 and the roller 102 respectively disposed at the upper side within the case body 24. Moreover, the positions of the enclosing member 5 and the roller unit 110 on the upper side and the enclosing member 5 and the roller unit 110 on the lower side in the moving direction of the seal belt 40 are not limited to being identical, but they may be slightly shifted from each other, for example.

In the further modification example described above, a relatively large deformation of the seal belt 40 is suppressed by the vertical wall 50B of the enclosing member 5 located on the rear surface side of the seal belt 40. Further, the roller 102 positioned on the rear surface side of the seal belt 40 like the vertical wall 50B also contributes to the suppression of the deformation of the seal belt 40. Therefore, the same as in the first exemplary embodiment, the sealing property against the opening 25 of the case body 24 can be improved. In this modification example, the vertical wall 50B and the roller 102 correspond to the deformation suppressing member for the seal belt 40. Then, when the seal belt 40 is not deformed or the amount of the deformation of the seal belt 40 is small, the roller 102 guides the movement of the seal belt 40 such that the sliding movement between the seal belt 40 and the vertical wall 50B is suppressed, so that the generation of the particles from the seal belt 40 is suppressed. In addition, since the sliding movement is suppressed, it is possible to achieve the longer lifetime of the seal belt 40.

Further, as shown in FIG. 14, the roller unit 102 may be equipped with a shaft 61 and a cam follower 62 which is a roller having a diameter larger than that of the shaft 61 and configured to be rotated about the shaft 61. According to this roller unit 110, the roller 102 is extended downwards and upwards from the base 101 having the bearings 103 respectively disposed above and below the seal belt 40. With this configuration, the roller 102 is made to have a small diameter, and the rotation axis of the roller 102 may be positioned at a position near the opening 25 which is a relatively forward position. Therefore, since the front-rear width of the roller unit 110 can be reduced, the enlargement of the case body 24 can be suppressed.

It should be noted that the above-described exemplary embodiment is illustrative in all aspects and is not anyway limiting. The above-described exemplary embodiment may be omitted, replaced and modified in various ways without departing from the scope and the spirit of claims.

EXPLANATION OF CODES

According to the exemplary embodiments, it is possible to suppress the scattering of the particles to the outside of the case body through the opening provided at the case body to connect the internal moving body within the case body to the external moving body, when linearly moving the external moving body connected to the internal moving body at the outside of the case body.

We claim:

1. A linearly moving mechanism, comprising:
a case body allowed to be evacuated;
an opening formed at the case body;
an internal moving body provided within the case body, and configured to be moved in a linear direction;
a connection member provided at the internal moving body to be protruded from the case body through the opening, connected to an external moving body at an outside of the case body, and configured to move the external moving body along with a movement of the internal moving body;
a seal belt extending in the linear direction and provided within the case body to close the opening, a first surface side of both end portions of the seal belt in a widthwise direction thereof facing an edge portion of the opening while being spaced apart therefrom; and
a deformation suppressing member provided to face a second surface side of the both end portions of the seal belt in the widthwise direction thereof in order to suppress deformation of the seal belt, the seal belt being connected to the internal moving body to be moved in the linear direction along with the movement of the internal moving body,
wherein the deformation suppressing member is provided on the second surface side of the both end portions of the seal belt in the widthwise direction thereof, and
the deformation suppressing member is equipped with a rotating body configured to be rotated around a rotation axis orthogonal to a moving direction of the seal belt to reduce friction against the seal belt.

2. The linearly moving mechanism of claim 1,
wherein the deformation suppressing member is provided on the second surface side of the both end portions of the seal belt in the widthwise direction while being spaced apart from the seal belt, and
when viewed from the linear direction, a recess portion surrounding the both end portions of the seal belt is formed, and a first sidewall and a second sidewall of the recess portion is respectively formed by the deformation suppressing member and the edge portion of the opening.

3. The linearly moving mechanism of claim 1,
wherein when viewed from the linear direction, a recess portion surrounding the both end portions of the seal belt is formed,
the deformation suppressing member includes the rotating body disposed in the linear direction and a first sidewall of the recess portion, and
the first sidewall of the recess portion is provided on the second surface side of the both end portions of the seal belt in the widthwise direction while being spaced apart from the seal belt, and the rotating body is located closer to the seal belt than the first sidewall of the recess portion is.

4. The linearly moving mechanism of claim 1,
wherein the external moving body is equipped with a substrate support configured to support a substrate for semiconductor manufacturing.

5. A method of suppressing scattering of particles, comprising:
evacuating a case body provided with an opening;
moving an internal moving body provided within the case body in a linear direction;
moving, by moving a connection member provided at the internal moving body to be protruded from the case body through the opening and connected to an external moving body at an outside of the case body, the external moving body along with a movement of the internal moving body;
moving the external moving body, which is provided at the outside of the case body and connected to the connection member, in the linear direction along with the movement of the internal moving body;
closing the opening by a seal belt extending in the linear direction and provided within the case body, a first surface side of both end portions of the seal belt in a widthwise direction thereof facing an edge portion of the opening while being spaced apart therefrom; and
suppressing, by a deformation suppressing member provided to face a second surface side of the both end portions of the seal belt in the widthwise direction thereof, deformation of the seal belt connected to the internal moving body to be moved in the linear direction along with the movement of the internal moving body,
wherein the deformation suppressing member is provided on the second surface side of the both end portions of the seal belt in the widthwise direction thereof, and
the deformation suppressing member is equipped with a rotating body configured to be rotated around a rotation axis orthogonal to a moving direction of the seal belt to reduce friction against the seal belt.

* * * * *